(12) United States Patent
Chuang et al.

(10) Patent No.: US 8,557,679 B2
(45) Date of Patent: Oct. 15, 2013

(54) OXYGEN PLASMA CONVERSION PROCESS FOR PREPARING A SURFACE FOR BONDING

(75) Inventors: Ta Ko Chuang, Painted Post, NY (US); Alex Usenko, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 513 days.

(21) Appl. No.: 12/827,666

(22) Filed: Jun. 30, 2010

(65) Prior Publication Data

US 2012/0003813 A1 Jan. 5, 2012

(51) Int. Cl.
*H01L 21/30* (2006.01)
*H01L 21/46* (2006.01)

(52) U.S. Cl.
USPC ............ 438/458; 438/455; 438/459; 257/686

(58) Field of Classification Search
USPC ....... 438/FOR. 244, 455, 458, 450, 406, 471, 438/459; 257/E27.137, E27.144, E29.161, 257/E21.122, 686, 777, E27.161, 778, 782, 257/783, E23.173, 635, 751
See application file for complete search history.

(56) References Cited

U.S. PATENT DOCUMENTS

| | | | |
|---|---|---|---|
| 5,374,654 A | 12/1994 | Vorbruggen et al. | 514/530 |
| 5,383,993 A * | 1/1995 | Katada et al. | 156/153 |
| 6,534,380 B1 * | 3/2003 | Yamauchi et al. | 438/455 |
| 6,599,814 B1 | 7/2003 | Vanhaelemeersch et al. | 438/431 |
| 6,645,828 B1 | 11/2003 | Farrens et al. | 438/455 |
| 6,833,195 B1 | 12/2004 | Lei et al. | 428/458 |
| 7,176,528 B2 | 2/2007 | Couillard et al. | 257/347 |
| 7,446,010 B2 | 11/2008 | Li et al. | 438/328 |
| 7,456,057 B2 | 11/2008 | Gadkaree et al. | 438/179 |
| 2004/0224482 A1 | 11/2004 | Kub et al. | 438/458 |

(Continued)

FOREIGN PATENT DOCUMENTS

WO 2008/021747 2/2008

OTHER PUBLICATIONS

T. Suni, et al., "Effects of Plasma Activation on Hydrophilic Bonding of Si and SiO$_2$", *Journal of The Electrochemical Society*, 2002, vol. 149, No. 6, pp. G348-G351.

(Continued)

*Primary Examiner* — Thanh Y Tran
(74) *Attorney, Agent, or Firm* — Ryan T. Hardee

(57) ABSTRACT

A process for preparing a surface of a material that is not bondable to make it bondable to the surface of another material. A non-bondable surface of a semiconductor wafer is treated with oxygen plasma to oxidize the surface of the wafer and make the surface smoother, hydrophilic and bondable to the surface of another substrate, such as a glass substrate. The semiconductor wafer may have a barrier layer thereon formed of a material, such as SixNy or SiNxOy that is not bondable to another substrate, such as a glass substrate. In which case, the oxygen plasma treatment converts the surface of the barrier layer to oxide, such as SiO2, smoothing the surface and making the surface hydrophilic and bondable to the surface of another substrate, such as a glass substrate. The converted oxide layer may be stripped from the barrier layer or semiconductor wafer with an acid, in order to remove contamination on the surface of the barrier layer or semiconductor wafer, the stripped surface may undergo a second oxygen plasma treatment to further smooth the surface, and make the surface hydrophilic and bondable to the surface of another substrate.

16 Claims, 7 Drawing Sheets

(56) References Cited

U.S. PATENT DOCUMENTS

| | | | |
|---|---|---|---|
| 2004/0229444 A1 | 11/2004 | Couillard et al. | 438/455 |
| 2005/0079712 A1* | 4/2005 | Tong et al. | 438/689 |
| 2006/0055003 A1* | 3/2006 | Tomita et al. | 257/629 |
| 2007/0141802 A1* | 6/2007 | Gadkaree | 438/455 |
| 2007/0246450 A1 | 10/2007 | Cady et al. | 219/250 |
| 2007/0249139 A1 | 10/2007 | Gadkaree et al. | 438/458 |
| 2009/0032873 A1 | 2/2009 | Cites et al. | 257/347 |
| 2009/0081845 A1* | 3/2009 | Yamazaki et al. | 438/406 |
| 2011/0104870 A1 | 5/2011 | Kobayashi et al. | 438/458 |
| 2011/0151643 A1 | 6/2011 | Kobayashi | 438/458 |

OTHER PUBLICATIONS

A. Tauzin, et al., "Transfers of 2-inch GaN films onto sapphire substrates using Smart Cut™ technology," Electronics Letters, May 26, 2005, vol. 41, No. 11, pp. 668-669.

S. Taylor, et al., "A review of the plasma oxidation of silicon and its applications," Semicond. Sci. Technol., 1993, vol. 8, pp. 1426-1433.

G.P. Kennedy, et al., "Oxidation of silicon nitride films in an oxygen plasma," Journal of Applied Physics, Mar. 15, 1999, vol. 85, No. 6, pp. 3319-3326.

L-Q. Xia, et al., "Chemical Vapor Deposition," Handbook of Semiconductor Manufacturing Technology, Chapter 13, Edited by Y. Nishi, R. Doering, CRC Press, 2007, pp. 13-1-13-88.

"SOI Wafer Fabrication Methods—Some Details," Handbook of Semiconductor Manufacturing Technology, Chapter 4.3, Edited by Y. Nishi, R. Doering, CRC Press, 2007, pp. 4-6-4-18.

X. Xie, et al., "Fabrication of silicon-on-insulator structure with $Si_3N_4$ as buried insulating films by epitaxial layer transfer," Journal of Crystal Growths, 2002, vol. 245, pp. 207-211.

H. Moriceau, et al., "New Layer Transfers Obtained by the SmartCut Process," Journal of Electronic Materials, 2003, vol. 32, No. 8, pp. 829-835.

S.N. Farrens, et al., "Chemical Free Room Temperature Wafer to Wafer Direct Bonding," J. Electrochem. Soc., Nov. 1985, vol. 142, No. 11, pp. 3949-3955.

B. Terreault, "Hydrogen blistering of silicon: Progress in fundamental understanding," Phys. Stat. Sol. (A), 2007, vol. 204, No. 7, pp. 2129-2184.

C.J. Tracy, et al., "Germanium-on-Insulator Substrates by Wafer Bonding," Journal of Electronic Materials, 2004, vol. 33, No. 8, pp. 886-892.

S.M. Sze, Physics of Semiconductor Device, Wiley and Sons, New York, 1981, pp. 790-799.

M.A. Green, "Solar Cells," Modern Semiconductor Device Physics, edited by S.M. Sze, Wiley and Sons, New York, 1998, pp. 498-530.

Q.-Y. Tong, et al., "Layer splitting process in hydrogen-implanted Si, Ge, SiC, and diamond substrates," Appl. Phys. Lett., Mar. 17, 1997, vol. 70, No. 11, pp. 1390-1393.

Z. Cheng, et al., "Relaxed Silicon-Germanium on Insulator Substrate by Layer Transfer," Journal of Electronic Materials, 2001, vol. 30, No. 12, pp. L37-L39.

C.H. Huang, et al., "Very Low Defects and High Performance Ge-On-Insulator p-MOSFETs with $Al_2O_3$ Gate Dielectrics," Symposium on VLSI Technology Digest of Technical Papers, 2003, pp. 119-120.

I.J. Malik, et al, "Fully Integrated Plasma-Activated Bonding (PAB) for High Volume SOI Substrate Manufacturing Process," 2000 International Conference on Solid State Devices and Materials X, pp. 490-491.

I.J. Malik, et al, "The Genesis Process™: A new SOI wafer fabrication method," Proceedings IEEE International SOI Conference, Oct. 1998, pp. 163-164.

S.N. Farrens, et al., "Chemical Free Room Temperature Wafer To Wafer Direct Bonding," J. Electrochem. Soc., Nov. 1995, vol. 142, No. 11, pp. 3949-3955.

I.J. Malik, et al., "Optoelectronic Substrates by SiGen NanoTec™—a General Layer-Transfer (LT) Approach," $206^{th}$ Meeting of the Electrochemical Society, 2004 Joint International Meeting, Meeting Abstracts, pp. 1340.

A.L. Thilderkvist, et al., "Surface Finishing of Cleaved SOI Films Using Epi Technologies," 2000 IEEE International SOI Conference, Oct. 2000, pp. 12-13.

M. Bruel, "Silicon on insulator material technology," Electronics Letters, Jul. 6, 1995, vol. 31, No. 14, pp. 1201-1202.

L.B. Freund, et al., "Film Stress and Substrate Curvature," Thin Film Materials, Cambridge University Press, 2003, p. 94.

* cited by examiner

OXYGEN PLASMA CONVERSION PROCESS FOR PREPARING A SURFACE FOR BONDING

BACKGROUND

The disclosure relates generally to a process for preparing a surface of a material for bonding to the surface of another material, more particularly, an oxygen plasma conversion process for treating a non-bondable surface of a substrate to make it bondable to the surface of another substrate, and more particularly, for making a non-bondable surface of a donor wafer bondable to the surface of a glass sheet to form a semiconductor on glass (SOG) substrate.

To date, the semiconductor material most commonly used in semiconductor-on-insulator structures has been single crystalline silicon. Such structures have been referred to in the literature as silicon-on-insulator structures and the abbreviation "SOI" has been applied to such structures. Silicon-on-insulator technology is becoming increasingly important for high performance thin film transistors, solar cells, and displays. Silicon-on-insulator wafers consist of a thin layer of substantially single crystal silicon 0.01-1 microns in thickness on an insulating material. As used herein, SOI shall be construed more broadly to include a thin layer of material on insulating semiconductor materials other than silicon and including silicon.

Various ways of obtaining SOI structures include epitaxial growth of silicon on lattice matched substrates. An alternative process includes the bonding of a single crystal silicon wafer to another silicon wafer on which an oxide layer of $SiO_2$ has been grown, followed by polishing or etching of the top wafer down to, for example, a 0.05 to 0.3 micron layer of single crystal silicon. Further methods include ion-implantation methods in which hydrogen ions are implanted in a donor silicon wafer to create a weakened layer in the wafer for separation (exfoliation) of a thin silicon layer that is bonded to another silicon wafer with an insulating (or barrier) oxide layer in between. The latter method involving hydrogen ion implantation is currently considered advantageous over the former methods.

U.S. Pat. No. 5,374,564 discloses a "Smart Cut" hydrogen ion implantation thin film transfer and thermal bonding process for producing SOI substrates. Thin film exfoliation and transfer by the hydrogen ion implantation method typically consists of the following steps. A thermal oxide film is grown on a single crystal silicon wafer (the donor wafer). The thermal oxide film becomes a buried insulator or barrier layer between the insulator/support wafer and the single crystal film layer in the resulting of SOI structure. Hydrogen ions are then implanted into the donor wafer to generate subsurface flaws. Helium ions may also be co-implanted with the Hydrogen ions. The implantation energy determines the depth at which the flaws are generated and the dosage determines flaw density at this depth. The donor wafer is then placed into contact with another silicon support wafer (the insulating support, receiver or handle substrate or wafer) at room temperature to form a tentative bond between the donor wafer and the support wafer. The wafers are then heat-treated to about 600° C. to cause growth of the subsurface flaws resulting in separation of a thin layer or film of silicon from the donor wafer. The assembly is then heated to a temperature above 1000° C. to fully bond the silicon to the support wafer. This process forms an SOI structure with a thin film of silicon bonded to a silicon support wafer with an oxide insulator or barrier layer in between the film of silicon and the support wafer.

As described in U.S. Pat. No. 7,176,528, the ion implantation thin film separation technique has been applied more recently to SOI structures wherein the support substrate is a glass or glass ceramic sheet rather than another silicon wafer. This kind of structure is further referred to as silicon-on-glass (SiOG), although semiconductor materials other than silicon may be employed to form a semiconductor-on-glass (SOG) structure. Glass provides cheaper handle substrate than silicon. Also, due to the transparent nature of the glass, the applications for SOI can be expanded to areas such as displays, image detectors, thermoelectric, photovoltaic, solar cell and photonic devices.

One potential issue with SOG is that the glass support or handle substrate contains metal and other constituents that may be harmful to the silicon or other semiconductor layer. Therefore, a barrier layer may be required between the glass substrate and the silicon layer in the SiOG. In some cases, this barrier layer facilitates the bonding of the silicon layer to the glass support substrate by making the bonding surface of the silicon layer hydrophilic. In this regard, a $SiO_2$ layer may be used to obtain hydrophilic surface conditions between the glass support substrate and the silicon layer. A native $SiO_2$ layer may be formed on the donor silicon wafer when it is exposed to the atmosphere prior to bonding. Additionally, the anodic bonding process disclosed in U.S. Pat. No. 7,176,528 (e.g. application of heat and voltage during bonding, which causing ions to move in the glass) creates an "in situ" $SiO_2$ layer between the silicon donor wafer or exfoliation layer and the glass substrate. If desired, a $SiO_2$ layer may be actively deposited or grown on the donor wafer prior to bonding. Another type of a barrier layer provided by the anodic bonding process disclosed in U.S. Pat. No. 7,176,528 is a modified ion depleted layer of glass in the glass substrate adjacent to the silicon layer. Anodic bonding substantially removes alkali and alkali earth glass constituents that are harmful for silicon from about 100 nm thick region in the surface of glass adjoining the bond interface.

The anodically created substantially alkali free glass barrier layer and the in situ or deposited $SiO_2$ barrier layers may, however, be insufficient for preventing sodium from moving from the glass substrate into the silicon layer. Sodium readily diffuses and drifts in $SiO_2$ and glasses under the influence of an electric field at slightly elevated temperatures, even at room temperature, possibly resulting in sodium contamination of the silicon layer on the glass substrate. Sodium contamination of the silicon layer may cause the threshold voltages of transistors formed in or on the SiOG substrate to drift, which in turn may cause circuits built on the SiOG substrate to malfunction.

Silicon nitride, $Si_3N_4$, is a much stronger barrier against movement of sodium, alkali metals, and other elements in the glass support substrate 102 into the silicon exfoliation layer 122 than either an ion depleted glass barrier layer 132 created by anodic bonding or an in situ or deposited $SiO_2$ barrier layer. $Si_3N_4$ is not, however, a material that is readily bondable to glass. Two smooth surfaces become bondable if both have the same hydrophilicity sign, e.g. if they are either both hydrophilic or both hydrophobic. By virtue of its chemical composition $Si_3N_4$ is hydrophobic, whereas glass surfaces can be easily rendered hydrophilic, but cannot readily be rendered hydrophobic. Therefore, the surface of the $Si_3N_4$ barrier layer should be treated to make it hydrophilic, thereby making the bonding surface of the donor wafer hydrophilic and readily bondable to the glass support substrate. Alternatively, the surface of the $Si_3N_4$ barrier layer may be coated with an auxiliary hydrophilic material layer or film, such as $SiO_2$ or other oxide, in order to make it hydrophilic.

PECVD deposition or growth of $SiO_2$ and other materials is well developed, and can be used for cost-efficient coating in mass production of oxide films. However, when growing a $SiO_2$ film on a $Si_3N_4$ barrier layer that also performs a stiffening function as disclosed herein, it is difficult to grow uniform silicon dioxide films of the small thickness required to maintain the stiffening function. Other methods of depositing or growing $SiO_2$ or other oxide films are known in the art, but these are generally too expensive to be used for making SiOG cost effectively and are generally not compatible with bonding. Moreover, deposition processes typically increase surface roughness, while low roughness is one of the requirements for effective bonding. It has been found that a surface roughness under 0.5 nm RMS, or under 0.3 nm RMS for 20×20 µm² AFM scan is required for defect free bonding, whereas deposition processes typically produce films having surface roughness above 0.3 nm RMS for 20×20 µm² AFM scan. Thus, additional smoothing of a deposited film would likely be required to ensure defect free bonding. Chemical mechanical polishing can be used to improve the roughness. However, the nitride barrier layer is a hard film, and polishing of such a film is an expensive operation. Also, the polishing itself is not enough to make the nitride surface bondable.

As described above, $SiO_2$ is bondable to glass, as its surface can be easily rendered hydrophilic by simple cleaning processes. Deposition of the $SiO_2$ film over a silicon nitride barrier layer is possible, but not preferable, because it results in an increase in surface roughness. Conversion of the surface of the $Si_3N_4$ barrier layer into an oxide by thermal oxidation is possible, but not preferred either. The thermal oxidation of silicon nitride requires temperatures exceeding 1000 C. At these temperatures silicon rectangular tiles warp and thus become non-bondable.

Another potential problem observed with SiOG substrates is the occurrence of micro structural defects in the form of canyons and pin holes in the thin silicon layer transferred during exfoliation of the silicon layer (the exfoliation layer) from the donor wafer. The canyons and pin holes may penetrate entirely through the silicon layer to the underlying glass substrate. When transistors are made in the silicon layer with the canyons and pin holes, the canyons and pin holes are likely to disrupt proper transistor formation and operation. Many of the canyons and the pinholes in the as transferred surface may be too deep to be easily removed with finishing operations such as polishing and etching.

The degradation in performance of silicon metal-oxide-semiconductor (MOS) devices with scaling caused by fundamental material limitations is forcing the semiconductor industry to consider extraordinary measures. Changes in semiconductor device structure (such as various forms of double-gated devices), alteration of semiconductor material properties in the channel region (such as SiGe alloys or strained silicon), and replacement of silicon altogether as the substrate material for the fabrication of semiconductor devices are all being considered. In view of the many challenges of introducing any of the preceding technologies into full production, other options that may reuse much of the silicon infrastructure and processing knowledge are attractive.

Substituting germanium for silicon as the semiconductor substrate material is one alternative that has the potential to use much of the existing silicon infrastructure and processing knowledge. The availability of good quality, bulk germanium wafers as large as 200 mm, combined with significantly larger carrier mobility for both electrons and holes for germanium compared to silicon are two positives of using germanium. Germanium is also a substrate of choice, because it can be made much thinner and lighter than gallium arsenide substrates, while still providing a suitable template for gallium arsenide (GaAs) epitaxy. GaAs is used to make devices such as microwave frequency integrated circuits (MMICs), infrared light-emitting diodes, laser diodes and solar cells. Compound III-V semiconductors grown on bulk germanium substrates have been used to create multi junction solar cells with efficiencies greater than 30%. However, these are prohibitively expensive for all but space applications. The Ge support or handle substrate constitutes a significant portion of the cost of Ge-based solar cells. There is a need in the art for a more affordable support or handle substrate having Ge surface or seed layer.

Germanium/Silicon (GE/Si) structures (or germanium on insulator (GeOI) substrates) formed by wafer bonding and layer transfer of a thin crystalline Ge layer by hydrogen implantation induced exfoliation have been considered as a way to reduce the product cost while maintaining solar cell device performance. By transferring thin, single-crystal layers of Ge from a bulk donor Ge wafer to a less expensive Si handle substrate, or another suitable less expensive semiconductor material handle substrate, or even to a glass substrate, the cost of the support substrate may be greatly reduced. By polishing and re-using the donor Ge wafer through a polish process, a single 300-µm-thick Ge donor wafer may serve as a source for the transfer of in excess of 100 thin Ge exfoliation or device layers, providing even greater cost savings on the production of a support substrate with a Ge surface or seed layer. Extremely high crystal-quality engineered germanium-on-insulator (GeOI) substrates have been created for next-generation processor, memory, MEMS and solar applications in this fashion.

GeOI structures may be formed using the above described ion implantation and thermal or anodic bonding thin film transfer processes as. However, these processes are not directly transferable to the transfer of germanium film to a glass handle substrate. Mechanical initiation of the cleaving action enables separation of the exfoliation layer at relatively low temperatures, such as at room temperature, thereby potentially enabling applications with severe thermal budget constraints, such as film transfer to glass substrates, and a reduction overall costs. However, the as-cleaved surface of the transferred germanium exfoliation layer or film exhibits a significant roughness on the order of 200 Ångstroms root mean square (RMS). This process therefore requires an additional step, such as chemical-mechanical polishing (CMP) or an epitaxy smoothing (ES) process, to reduce the surface roughness and thin the Ge exfoliation layer to the final desired finish and thickness. Moreover, GeOG structures made employing traditional Smart-Cut processes or anodic bonding processes exhibit poor Ge film uniformity. The Ge film does not bond well to the glass, and may require external pressure to force bonding of the GE layer to the glass. The Smart-Cut process with pressure forced bonding, however, produces Ge films containing fractures, cracks, and voids and makes the layer transfer difficult to control.

There is a need in the art for a process, surface chemistry and/or surface treatment for economically improving the transfer and bonding of a Ge layer to a support substrate, such as a glass, glass ceramic, or semiconductor substrate. There also is a need in the art for a process, surface chemistry and/or surface treatment for economically improving the bondability of a silicon nitride barrier layer to support substrate, such as a glass, glass ceramic, or semiconductor substrate.

No admission is made that any reference cited herein constitutes prior art. Applicant expressly reserves the right to challenge the accuracy and pertinence of any cited documents.

SUMMARY

According to one embodiment disclosed herein, an oxygen plasma treatment process is employed to prepare the surface of a semiconductor donor wafer for bonding and transfer of a semiconductor layer to a glass or glass-ceramic support substrate. The semiconductor donor wafer may have a barrier layer formed thereon. In which case, the oxygen plasma treatment process is performed on the surface of the barrier layer to prepare the surface of the barrier layer for bonding and transfer of a semiconductor layer to a glass or glass-ceramic support substrate. The barrier layer may be formed of silicon nitrides ($Si_xN_y$), silicon oxy-nitrides ($SiN_xO_y$), or any other suitable barrier layer material.

According to an embodiment disclosed herein, a reactive-ion-etch (RIE) oxygen plasma process is employed to prepare the surface of a Ge donor wafer for bonding.

According to further embodiment hereof, a new semiconductor-on-glass product with a deposited barrier layer, more specifically, germanium-on-glass with a deposited barrier layer is provided. Suitable barrier layer or layers include: silicon nitrides (SixNy), and silicon oxy-nitrides (SiNxOy).

Also disclosed herein is a process of preparing a non-bondable surface of a semiconductor wafer for bonding to another substrate. The method may include the steps of obtaining a semiconductor wafer having a bonding surface that is not bondable to another substrate; and treating the bonding surface of the semiconductor wafer with oxygen plasma to oxidize the bonding surface of the semiconductor wafer and convert a surface region of the semiconductor wafer into an oxide layer that is hydrophilic and bondable to another substrate.

Prior the step of treating the bonding surface of the semiconductor wafer, the process may also include the steps of: implanting ions through the bonding surface into the semiconductor wafer to form a weakened region in the donor wafer and defining a semiconductor exfoliation layer in the semiconductor wafer between the weakened region and the bonding surface, the implanting step contaminates a surface region of the bonding surface of the donor wafer; wherein the step of treating the bonding surface of the semiconductor wafer converts at least the contaminated surface region of the bonding surface of the donor wafer into a sacrificial oxide layer; stripping the sacrificial oxide layer from the bonding surface of the donor wafer, thereby removing the contaminated surface region of the bonding surface of the donor wafer and revealing a clean bonding surface of the semiconductor wafer; and treating the clean bonding surface of the semiconductor wafer with oxygen plasma to oxidize the bonding surface of the semiconductor wafer and convert a surface region of the semiconductor wafer into an oxide bonding layer that is hydrophilic and bondable to another substrate.

The process may include the steps of obtaining an insulating support substrate having a bonding surface; contacting the bonding layer of the semiconductor wafer with the bonding surface of the support substrate; bonding the bonding layer to the support substrate; and separating the exfoliation layer from a remaining portion of the semiconductor wafer, leaving the exfoliation layer bonded to the support substrate.

The support substrate may be a glass substrate. The donor wafer may be a semiconductor wafer formed from of silicon (Si), germanium-doped silicon (SiGe), silicon carbide (SiC), germanium (Ge), gallium arsenide (GaAs), GaP, or InP.

The semiconductor wafer may be formed of Ge with an oxide layer is formed therein with a thickness from about 50 nm to about 150 nm.

A surface of the semiconductor wafer used in the process may have a barrier layer thereon formed of a barrier material that is not bondable to another substrate, the barrier layer forms the bonding surface of the semiconductor wafer. The process include the sep or treating the bonding surface of the semiconductor wafer with oxygen plasma converts a near surface region of the barrier layer into an oxide layer that is hydrophilic and bondable to another substrate, while a remaining portion of the barrier layer remains un-oxidized barrier material.

The barrier layer may optionally be formed of one of SixNy, SiNxOy, or Si3N4.

The process may include the step of treating the bonding surface of the semiconductor wafer converts the surface region of the barrier layer into a SiO2 layer having a thickness of about 2 nm to about 150 nm, about 5 nm to about 50 nm, about 2 nm to about 20 nm, about 5 nm to about 10 nm, or about 5 nm and a surface roughness of less that 0.3 nm RMS.

The process may include the steps of obtaining a glass substrate having a bonding surface; contacting the oxide layer on the barrier layer with the bonding surface of the glass substrate; bonding the oxide layer to the glass substrate; and separating the exfoliation layer from a remaining portion of the semiconductor wafer, leaving the exfoliation layer bonded to the support substrate via the oxide layer with remaining portion of the barrier layer located between the exfoliation layer and the oxide layer.

The glass substrate may be an oxide glass or oxide glass-ceramic substrate.

The step of bonding the exfoliation layer to the glass substrate may include applying a voltage potential across the glass substrate and the semiconductor wafer, and the elevated temperature and the voltage are maintained for a period of time sufficient for positive ions within the oxide glass or oxide glass-ceramic to move within the glass substrate in a direction away from the semiconductor wafer, such that the glass substrate includes (i) a first glass layer adjacent to the exfoliation layer in which substantially no modifier positive ions are present, and (ii) a second glass layer adjacent the first glass layer having an enhanced concentration of modifier positive ions.

Prior the step of treating the bonding surface of the semiconductor wafer, the process may include the steps of implanting ions through the barrier layer into the semiconductor wafer to form a weakened region in the donor wafer and defining a semiconductor exfoliation layer in the semiconductor wafer between the weakened region and barrier layer, the implanting step contaminates a surface region of the barrier layer; wherein the step of treating the bonding surface of the semiconductor wafer converts at least the contaminated surface region of the barrier layer into a sacrificial oxide layer; stripping the sacrificial oxide layer from the barrier, thereby removing the contaminated surface region of the barrier layer and revealing a cleaned bonding surface on the barrier layer; and treating the cleaned bonding surface with oxygen plasma to oxidize the bonding surface of the barrier layer and convert a surface region of the barrier layer into an oxide bonding layer is hydrophilic and bondable to the glass substrate.

The process may include the step of treating the cleaned bonding surface with oxygen plasma is conducted for a processing time of from about 2 minutes to about 50 minutes, or from about 10 minutes to about 25 minutes, about 5 minutes to about 20 minutes, or 10 minutes to about 20 minutes and produces an oxide bonding layer with a thickness of about 10 nm or less, about 7 nm or less, or from about 2 nm to about 20 nm, and with a surface roughness of about 0.3 nm RMS or less.

The process may include the step of treating the cleaned bonding surface with oxygen plasma converts a surface region of the barrier layer into an oxide bonding layer having a surface roughness of 0.3 nm RMS or less thereby smoothing the surface of the barrier layer.

The barrier layer may be deposited on the bonding surface of the semiconductor wafer and is deposited with a thickness of about 100 nm or greater, about 250 nm or greater, or about 350 nm or greater.

The semiconductor wafer may be formed of substantially single crystal silicon.

The step of treating the bonding surface of the semiconductor wafer with oxygen plasma may be conducted for a processing time of from about 2 minutes to about 50 minutes, or from about 10 minutes to about 25 minutes, about 5 minutes to about 20 minutes, or 10 minutes to about 20 minutes.

Additional features and advantages will be set forth in the detailed description which follows, and in part will be readily apparent to those skilled in the art from the description or recognized by practicing the embodiments as described in the written description and claims hereof, as well as the appended drawings. It is to be understood that both the foregoing general description and the following detailed description are merely exemplary, and are intended to provide an overview or framework to understand the nature and character of the claims.

The accompanying drawings are included to provide a further understanding, and are incorporated in and constitute a part of this specification. The drawings illustrate one or more embodiment(s), and together with the description serve to explain principles and operation of the various embodiments. [If there are no appended drawings, amend accordingly.

DETAILED DESCRIPTION

Although the features, aspects and embodiments disclosed herein may be discussed in relation to silicon-on glass (SiOG) and germanium-on-glass (GeOG) structures and the manufacture of SiOG and GeOG structures, skilled artisans will understand that this disclosure need not be and is not limited to SiOG and GeOG structures. Indeed, the broadest protectable features and aspects disclosed herein are applicable to any process in which ion implantation thin film transfer techniques are employed to transfer and bond a thin film of a semiconductor material onto a glass, glass-ceramic or semiconductor support or handle substrate to produce semiconductor-on-glass (SOG) structures or semiconductor-on-insulator (SOI, typically semiconductor-on-semiconductor) structures. For ease of presentation, however, the disclosure herein is primarily made in relation to the manufacture of SiOG and GeOG structures. The specific references made herein to SiOG and GeOG structures are to facilitate the explanation of the disclosed embodiments and are not intended to, and should not be interpreted as, limiting the scope of the claims in any way to SiOG or GeOG substrates unless explicitly stated otherwise. The processes described for the fabrication of SiOG and GeOG substrates are equally applicable the manufacture of other SOG and SOI substrates. Unless explicitly stated otherwise, the SiOG, SOG, GeOG and SOI abbreviations as used herein should be viewed as referring to semiconductor-on-glass (SOG) structures in general, including, but not limited to, silicon-on-glass (SiOG) structures, germanium-on-glass (GeOG) structures, as well as to semiconductor-on-insulator (SOI) structures.

SOG structures may have suitable uses in connection with fabricating thin film transistors (TFTs), e.g., for display applications, including organic light-emitting diode (OLED) displays and liquid crystal displays (LCDs), integrated circuits, photovoltaic devices, thermoelectric devices, sensors, solar cells, etc. Although not required, the semiconductor material of the layer may be in the form of a substantially single-crystal material. The word "substantially" is used in describing the layer to take into account the fact that semiconductor materials normally contain at least some internal or surface defects either inherently or purposely added, such as lattice defects or a few grain boundaries. The word "substantially" also reflects the fact that certain dopants may distort or otherwise affect the crystal structure of the bulk semiconductor.

Figure 1:
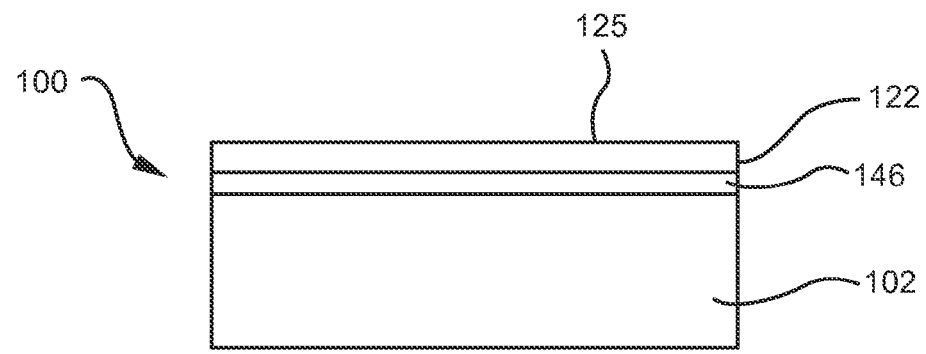
FIG. 1 is a diagrammatic side view of an SiOG substrate fabricated using conventional ion implantation film transfer processes.

With reference to the drawings, wherein like numerals indicate like elements, reference is now made to FIGS. 1-7, which illustrate a general ion implantation film transfer process (and resultant intermediate structures) for fabricating an SOG structure with the aforementioned barrier layer in accordance with an embodiment hereof. Turning first to FIG. 1, a semiconductor donor wafer 120 is prepared, such as by polishing, cleaning, etc. to produce a relatively flat and uniform implantation surface 121 suitable for bonding to the support or handle substrate 102 (see FIGS. 7 and 8), e.g., a glass or glass-ceramic substrate. By way of example only, the semiconductor donor wafer 120 may be a substantially single crystal Si wafer, although as discussed above any other suitable semiconductor material may be employed. Regular round 300 mm prime grade silicon wafers may be chosen for use as donor wafers or substrates 120 for the fabrication of SiOG structures or substrates. The donor wafers may have <001> crystalline orientation and 8-12 Ohm/cm resistivity, and be Cz grown, p-type, boron doped wafers. Crystal Originated Particle (COP) free wafers may be chosen, because the COPs might obstruct the film transfer process or disturb transistor operation. Doping type and level in the wafers may be chosen to obtain desirable threshold voltages in eventual transistors to be subsequently made on the SiOG substrates. The largest available wafer size 300 mm may be chosen, because this will allow economical SiOG mass production.

According to a further embodiment hereof, 180×230 mm rectangular donor wafers or donor tiles may be cut from the initially round wafers. The donor tile edges may be processed with a grinding tool, lasers, or other known techniques, in order to profile the edges and obtain a round or chamfered profile similar to SEMI standard edge profile. Other required machining steps, such as corner chamfering or rounding and surface polishing, may also be performed. Such donor wafer substrates or tiles may also be used to fabricate rectangular SOG structures in accordance with a further embodiment hereof. Alternatively, the donor wafer may be left as round wafers and be used to transfer round semiconductor films/exfoliation layers to square or round glass or glass ceramic substrates.

According to one embodiment hereof, a $SiN_xO_y$ or $Si_xN_y$ material, such $Si_3N_4$, barrier layer 142 is deposited on a silicon donor wafer 120 prior to placing the donor wafer in contact with the support substrate. The barrier layer 142 may be deposited on the bonding surface 121 of the donor wafer 120 using a low pressure chemical vapor deposition (LPCVD), or other suitable deposition process, such as plasma-enhanced chemical vapor deposition (PECVD). The $Si_3N_4$ barrier layer may be formed on the donor wafer with a thickness of about 100 nm or greater, about 250 nm or greater, or about 350 nm or greater. Alternatively, the barrier layer may be deposited on the glass support substrate with a thickness of about 50 nm or greater, about 100 nm or greater, about 250 nm or greater, or about 350 nm or greater.

Barrier layers 142 formed of other non-bondable materials other than $Si_xN_y$ and $SiN_xO_y$ may be used in accordance herewith. Particularly, silicon carbide or molybdenum films may be used as a barrier or stiffening layer and treated with an oxygen plasma to smoothen the layer's surface or render it bondable as described herein. Unsuitable materials are those that would contaminate the semiconductor layer or the electronic devices formed in or on the semiconductor layer in the end SOG structure.

The $Si_3N_4$ barrier layer 142 may be deposited on the donor wafer 120, with or without stripping of a native oxide film 146 from the donor wafer 120. In instances where the $Si_3N_4$ barrier layer is also serving as a stiffening layer, as disclosed in contemporaneously filed application entitled Silicon On Glass Substrate With Stiffening Layer and Process of Making the Same, then the $SiO_2$ layer 146 should not be formed too thick. Since a $SiO_2$ layer has a relatively low elastic modulus material (Young's modulus of 70), any excessive thickness of the oxide layer 146 may lower the barrier effect of the relatively hard $Si_3N_4$ barrier layer (Young's modulus of 150 GPa). If the thickness of the oxide layer is much smaller than the thickness of the silicon exfoliation layer to be transferred, such as 10% of the thickness of the exfoliation layer, then the oxide layer will not detrimentally lower the barrier effect of the barrier layer. On the other hand, this oxide layer serves to insulate the Si layer from $Si_3N_4$ electrical charges. Thus there is a tradeoff between enhanced inhibition of canyons and pin hole formation with a relatively thin oxide layer and enhanced barrier performance with a relatively thick oxide layer. Up to a 200 nm silicon exfoliation layer may be transferred. When the barrier layer 142 is serving a stiffening function as well as a barrier function, then the thickness of the oxide layer 146 should be within the range from about 1 nm to about 10 nm or less, or from about 2 nm to about 5 nm, or it may be about 20 nm or less, about 10 nm or less, or about 7 nm or less, so as not to diminish the stiffening effect. When the barrier layer 142 is serving a barrier function only, then the thickness of the oxide layer 1456 may be about 100 nm or less.

Figure 3:
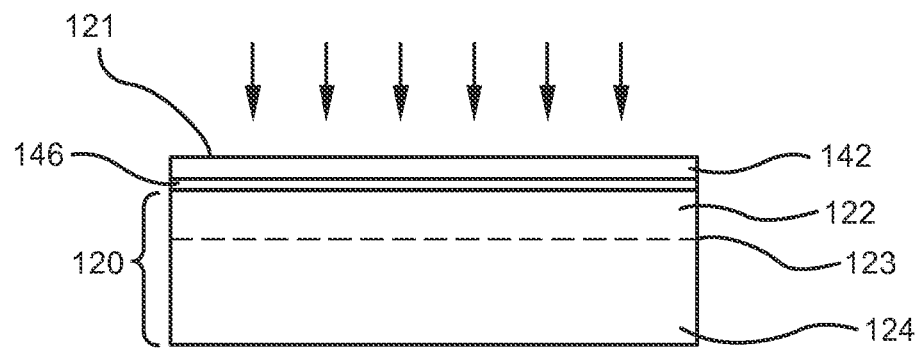
FIG. 3 is a diagrammatic side view of the donor wafer of FIG. 2 being implanted with ions in accordance with an embodiment of the present invention.

As illustrated in FIG. 3, Hydrogen ions (such as $H^+$ and/or $H^{2+}$ ions) are then implanted (as indicated by the arrows in FIG. 6) through the $Si_3N_4$ barrier layer 142 into the bonding surface 121 of the donor wafer 120 to a desired depth to form a damage/weakened zone or layer 123 in the silicon donor wafer 120. Co-implantation of Helium ions with the Hydrogen ions, as is well understood in the art, may also be employed to form the weakened region 123. An exfoliation layer 122 (with the oxide layer 146 and the barrier layer 142 thereon) is thereby defined in the donor wafer 120 between the weakened zone 123 and the bonding surface 121 of the donor wafer. As is well understood in the art, the ion implantation energy and density may be adjusted to achieve a desired thickness of the exfoliation layer 122, such as between about 300-500 nm, although any reasonable thickness may be achieved.

Appropriate implantation energies for a desired thickness of transferred film (e.g. implantation depth) can be calculated using a SRIM simulation tool. As the ion stopping powers of silicon and silicon nitride are different, the $Si/Si_3N_4$ target has to be modeled in the SRIM input in order to calculate the appropriate implantation energy. One of skill in the art will understand how to determine an appropriate implantation energy for a desired implantation depth for any given implantation ion or species, donor wafer material, barrier layer material, and any other material layers on the bonding surface 121 of the bonding wafer. For example, for $H^{2+}$ ions implanted at an energy of 60 keV through a 100 nm $Si_3N_4$ barrier layer into the donor wafer 120 will form an exfoliation layer 122, including the $Si_3N_4$ barrier layer, having a thickness of about 205 nm for transfer.

Figure 4:
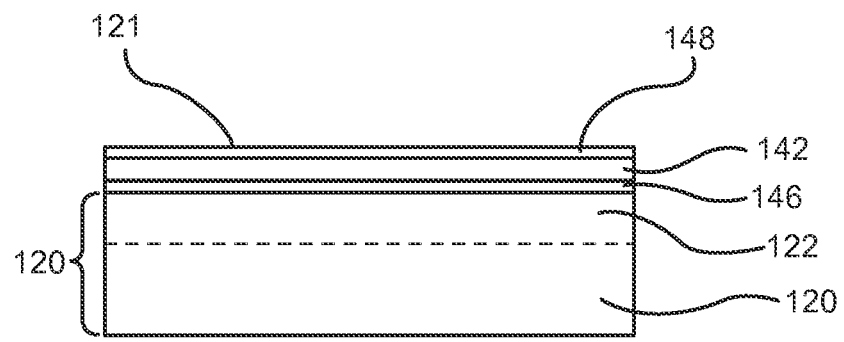
FIG. 4 is a diagrammatic side view of the silicon donor wafer of FIG. 3 with an oxide layer formed on the barrier layer in accordance with an embodiment of the present invention.

According one embodiment as illustrated in FIG. 4, oxygen plasma conversion of a near surface region of the bonding surface 121 of the $Si_3N_4$ barrier layer 142 into a $SiO_2$ oxide bonding layer 148 is performed. The oxide boding layer 148 makes the bonding surface 121 of the barrier layer 142 hydrophilic and bondable to a glass or other support substrate. The $SiO_2$ oxide bonding layer 148 may be formed with a thickness of about 2 nm to about 150 nm, about 5 nm to about 150 nm, about 5 nm to about 50 nm, about 2 nm to about 20 nm, about 5 nm to about 10 nm, or about 5 nm $SiO_2$ oxide bonding layer 148. The bonding layer 148 should be thick enough to absorb water at the interface and thin enough to limit surface roughness after deposition within acceptable ranges for effective bonding. This results in an oxide-nitride-oxide 146-142-148 (ONO) structure on the bonding surface 121 silicon donor wafer 120. The bottom 146 and top 148 oxides in the ONO structure may be respectively called a pad oxide and cap oxide. The thickness of all three films are carefully chosen to produce the desired barrier or canyon and pin hole prevention effect. Such an ONO structure may be employed in other embodiments described herein.

Plasma oxidation methods are known, but have not, prior to this disclosure, been utilized to render a nitride surface bondable. Moreover, prior to this disclosure, it was not known in the art that by properly choosing plasma processing conditions, the surface roughness of a plasma oxidation converted film can be improved as compared to the surface roughness of initial nitride film, as discussed in more detail hereinafter.

Oxygen plasma conversion of the near-surface region 148 of the $Si_3N_4$ barrier layer 142 into a $SiO_2$ oxide layer prior to pre-bonding may consist of the following steps. First, the implanted donor wafer 120 with the $Si_3N_4$ barrier layer 142 deposited thereon, as illustrated in FIG. 3, is placed in a plasma chamber and processed with oxygen plasma. The oxygen plasma conversion process conditions are chosen such that a 2 nm to about 20 nm thick, or about 5 nm to about 10 nm thick, or about a 5 nm thick $SiO_2$ film 148 is formed in the near surface region or portion of the $Si_3N_4$ barrier layer 142. This step simultaneously (1) converts a portion of the surface of the $Si_3N_4$ barrier layer 142 into a $SiO_2$ layer 148, as illustrated in FIG. 3, and (2) smoothens the surface 121 of the $Si_3N_4$ barrier layer. Both the oxidation and smoothing of bonding surface 121 of the $Si_3N_4$ film increase the bondability of the donor wafer 120 to a glass or other support substrate. The donor wafer 120 may then be prepared for bonding by processing in RCA solution and drying. The oxygen plasma conversion step may be performed before or after implantation of the donor wafer as illustrated in FIG. 3.

Optionally, double plasma conversion of the $Si_3N_4$ barrier layer 142 on the silicon donor substrate 120 may be performed. A double plasma conversion process may be performed on the donor wafer following ion implantation, in order to ensure complete cleaning of organic contamination attained on the donor wafer during the ion implantation step and to further improves the roughness of the bonding surface 121. Double plasma conversion may be performed in 3 steps: (1) a first oxygen plasma conversion or treatment step to convert the surface of the $Si_3N_4$ barrier layer 142 on the implanted silicon donor wafer into a first or $SiO_2$ sacrificial layer 148, (2) wet stripping of the first, $SiO_2$ sacrificial layer 148 from the donor wafer, and (3) a second oxygen plasma conversion or treatment step to convert the surface of the $Si_3N_4$ barrier layer 142 on the implanted silicon donor wafer into a second $SiO_2$ bonding layer 148. The first plasma conversion step forms a $SiO_2$ sacrificial layer 148 that contains all or substantially all of the carbon contamination from organics deposited in the bonding surface 121 of the donor wafer during ion implantation. The stripping step removes the sacrificial layer 148, and thereby removes the carbon contamination contained in the sacrificial layer and reveals a clean $Si_3N_4$ surface. The second plasma conversion step forms a pure $SiO_2$ boding layer 148 (that may be thin enough to retain high surface stiffness of the $Si_3N_4$ barrier layer 142 if desired) that is smooth enough to enable hydrophilic bonding to the glass substrate.

Following implantation or plasma conversion, the bonding surface 121 of the donor wafer 120 is cleaned to remove dust and contaminants in preparation for bonding. The donor wafer may be prepared for bonding by processing the donor wafer in an RCA solution and drying. The glass sheets 102, or other material substrates to be used as the support substrate, are also cleaned to remove dust and contaminants in preparation for bonding. The glass sheets may be cleaned using a wet ammonia process to remove dust and contaminants and terminate the glass surface with hydroxyl groups for rendering the bonding surface of the glass highly hydrophilic for bonding of the glass 102 to the bonding surface 121 of the donor wafer 120. The glass sheets may then be rinsed in de-ionized water and dried. One of skill in the art will understand how to formulate suitable washing solutions and procedures for the donor wafers and the glass (or other material) support substrates.

The glass support substrate 102 may be any suitable insulating glass material exhibiting any desirable characteristics, such as a glass, oxide glass, oxide glass-ceramic, or polymer material. As between oxide glasses and oxide glass-ceramics, the oxide glasses have the advantage of being simpler to manufacture, thus making glasses more widely available and less expensive than glass-ceramics. By way of example, a glass substrate may be formed from glass containing alkaline earth ions, such as substrates made of Corning Incorporated glass composition no. 1737, Corning Incorporated Eagle 2000™ glass, or Corning Incorporated Eagle XG™ glass. These Corning Incorporated fusion formed glasses have particular use in, for example, the production of liquid crystal displays. Moreover, the low surface roughness of these glasses that is required for fabrication of liquid crystal display backplanes on the glass is also advantageous for effective bonding as described herein. Eagle glass is also free from heavy metals and other impurities, such as arsenic, antimony, barium, that can adversely affect the silicon exfoliation/device layer. Being designed for the manufacture of flat panel displays with polysilicon thin film transistors, Eagle glass has a carefully adjusted coefficient of thermal expansion (CTE) that substantially matches the CTE of silicon, e.g. a Eagle glass has a CTE of $3.18 \times 10-6$ C−1 at 400° C. and silicon has a CTE of $3.2538 \times 10-6$ at 400° C. Eagle glass also has a relatively high strain point of 666° C., which is higher than the temperature needed to trigger exfoliation (typically around 500° C.). These two features, e.g. ability to survive exfoliation temperatures and CTE match with silicon, are main reasons for choosing Eagle glass for the silicon layer transfer and bonding. Advantageous glasses for the bonding processes disclosed herein will also have a surface roughness of about 0.5 nm RMS or lower, about 0.3 nm RMS or lower, or about 0.1 nm RMS or lower. Since exfoliation of the donor wafer typically happens around 500° C., the strain point of the glass should be greater than 500° C.

The glass substrates may be rectangular in shape and may be large enough to hold several donor wafers arrayed on the bonding surface of the glass. In which case, a single donor wafer-glass assembly as placed into the furnace/bonder for film transfer would include a plurality of donor wafers arrayed on the surface of a single glass sheet. The donor wafers may be round semiconductor donor wafers or they may be rectangular semiconductor donor wafers/tiles. The resulting SOG product would comprise a single glass sheet with a plurality of round or rectangular silicon films bonded thereto.

As used herein, the term "donor tiles" is generally intended to indicate rectangular donor wafers and the term "donor wafers" is generally intended to indicate round donor wafers. However, unless it explicitly stated or clear that round or rectangular donor wafers are required for any particular embodiment described herein, the terms "donor wafers" and "donor tiles" should be understood to include either round or rectangular donor wafers.

Figure 5:
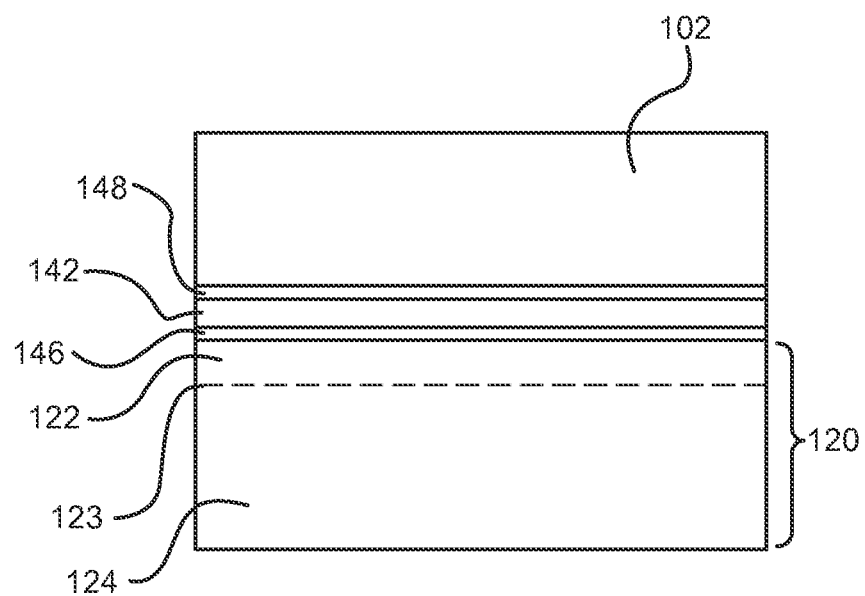
FIG. 5 is a diagrammatic side view of an implanted silicon donor wafer pre-bonded to a glass support or handle substrate layer in accordance with an embodiment of the present invention.

With reference now to FIG. 5, the bonding surface 121 of the exfoliation layer 122 (with the barrier layer 142 thereon) is then pre-bonded to the glass support substrate 102. The glass and the wafer, especially in the case of rectangular donor wafer or tile, may be pre-bonded by initially contacting them at one edge, thereby initiating a bonding wave at the one edge, and propagating the bonding wave across the donor wafer and support substrate to establish a void free pre-bond. The resulting intermediate structure is thus a stack including the exfoliation layer 122 of the semiconductor donor wafer 120, a remaining portion 124 of the donor wafer 120, and the glass support substrate 102.

Figure 6:
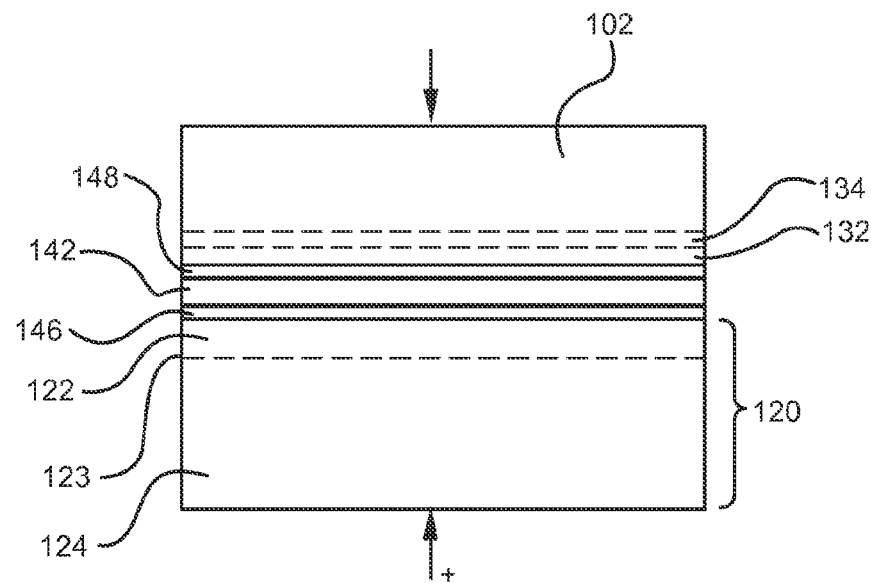
FIG. 6 is a diagrammatic side view of an implanted silicon donor wafer in the process of being bonded to a glass support or handle substrate layer in accordance with an embodiment of the present invention.

Next, as illustrated in FIG. 6, the glass support substrate 102 may be bonded to the exfoliation layer 122 using an electrolysis process (also referred to herein as an anodic bonding process) or by a thermal bonding process such as a "Smart Cut" thermal bonding process. A basis for a suitable anodic bonding process may be found in U.S. Pat. No. 7,176,528, the entire disclosure of which is hereby incorporated herein by reference. Portions of this process are discussed below. A basis for a suitable Smart Cut thermal bonding process, which may alternatively be employed, may be found in U.S. Pat. No. 5,374,564, the entire disclosure of which is hereby incorporated herein by reference.

According to one embodiment disclosed herein, the pre-bonded glass-donor wafer assemblies are placed in a furnace/bonder for bonding and film transfer/exfoliation. The glass-donor wafer assemblies may be placed horizontally in a furnace or bonder in order to prevent the remaining portions of the donor wafers from sliding on the newly transferred exfoliation layer following exfoliation and scratching the newly created silicon film 122 on the glass substrate substrates 102. The glass-donor wafer assemblies may be arranged in the furnace with the silicon donor wafer 120 on the bottom, downward facing side of the glass support substrate 102. With this arrangement, the remaining portion 124 of the silicon wafer may be allowed to simply drop down away from the newly exfoliated and transferred exfoliation layer 122 following exfoliation or cleaving of the exfoliation layer 122. Scratching of the newly created silicon film (the exfoliation layer) on the glass may thus be prevented. Alternatively, the glass-donor wafer assemblies may be placed horizontally in the furnace with the donor wafer on top of the glass substrate. In which case, the remaining portion 124 of the donor wafer must be carefully lifted from the glass substrate to avoid scratching the newly exfoliated silicon film 122 on the glass.

Once the pre-bonded glass-silicon assembly is loaded into the furnace, the furnace may be heated to 100-200° C. for 1 hour during a first heating step. This first heating step increases the bonding strength between the silicon and the glass thus eventually improving layer transfer yield. The temperature may then be ramped up to as high as 600° C. to cause exfoliation during a second heating step. By way of example, the temperature during the second heating step may be within about +/−350° C. of a strain point of the glass substrate 102, more particularly between about −250° C. and 0° C. of the strain point, and/or between about −100° C. and −50° C. of the strain point. Depending on the type of glass, such temperature may be in the range of about 500-600° C. In addition to the above-discussed temperature characteristics, mechanical pressure (as indicated by the arrows 130 in FIG. 3) may be applied to the intermediate assembly. The pressure range may be between about 1 to about 50 psi. Application of higher pressures, e.g., pressures above 100 psi, might cause breakage of the glass substrate 102. One skilled in the art can properly design furnace processing for exfoliation as it is described herein and as described, for example, in U.S. Pat. Nos. 7,176,528 and 5,374,564, and U.S. published patent application Nos. 2007/0246450 and 2007/0249139.

According to one embodiment hereof, anodic bonding may employed. In the case of an anodic bonding, a voltage potential (as indicated by the arrows and the + and − in FIG. 6) is applied across the intermediate assembly during the second heating step. For example a positive electrode is placed in contact with the semiconductor donor wafer 120 and a negative electrode is placed in contact with the glass substrate 102. The application of a voltage potential across the stack at the elevated bonding temperature during the second heating step induces alkali, alkaline earth ions or alkali metal ions (modifier ions) in the glass substrate 102 adjacent to the donor wafer 120 to move away from the semiconductor/glass interface further into the glass substrate 102. More particularly, positive ions of the glass substrate 102, including substantially all modifier ions, migrate away from the higher voltage potential of the donor semiconductor wafer 120, forming: (1) a reduced (or relatively low as compared to the original glass 136/102) positive ion concentration layer 132 in the glass substrate 102 adjacent the exfoliation layer 122; (2) an enhanced (or relatively high as compared to the original glass 136/102) positive ion concentration layer 134 in the glass substrate 102 adjacent the reduced positive ion concentration layer; while leaving (3) a remaining portion 136 of the glass substrate 102 with an unchanged ion concentration (e.g. the ion concentration of remaining layer 136 is the same as the original "bulk glass" substrate 102). The reduced positive ion concentration layer 132 in the glass support substrate performs a barrier functionality by preventing positive ion migration from the oxide glass or oxide glass-ceramic into the exfoliation layer 122.

Figure 7:
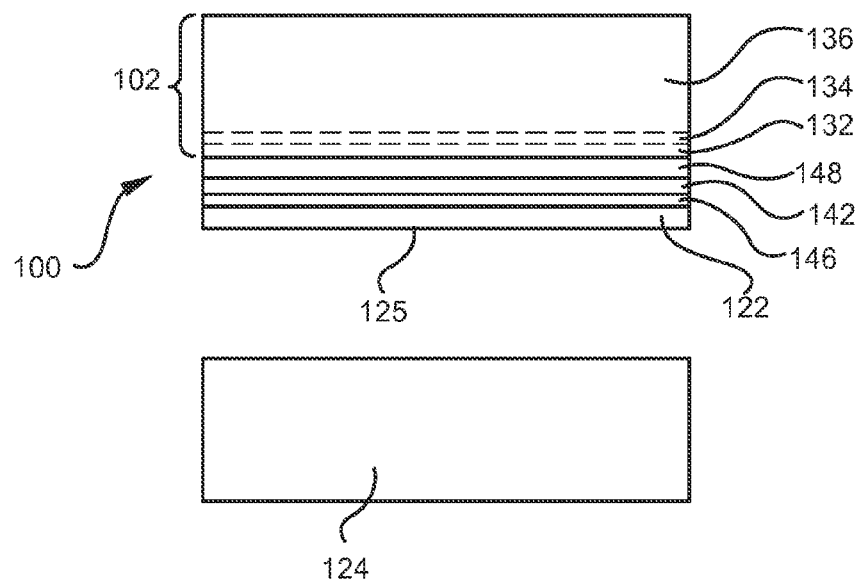
FIG. 7 is a diagrammatic side view of the exfoliation layer separated from a remaining portion of the donor wafer and bonded to a glass support substrate in accordance with an embodiment of the present invention.

With reference now to FIG. 7, after the intermediate assembly is held under the conditions of temperature, pressure and voltage for a sufficient time, the voltage is removed and the intermediate assembly is allowed to cool to room temperature. At some point during heating, a dwell time, during cooling, and/or after cooling, the exfoliation layer 122 is anodically bonded to the glass substrate and separates (exfoliates or cleaves) from the remaining portion 124 of the donor wafer, but not necessarily in that order. The separation of the exfoliation layer 122 from the remaining portion 124 of the donor wafer may be accomplished via spontaneous fracture of the donor wafer 120 along the implanted region 123 due to thermal stresses. Alternatively or in addition, mechanical stresses such as water jet cutting or chemical etching may be used to initiate, facilitate or control the separation process. The remaining portion 124 of the donor wafer 120 is subsequently removed from the exfoliation layer 122, leaving the exfoliation layer bonded to the glass substrate 102. This may include some mechanical peeling if the exfoliation layer 122 has not already become completely free from the remaining portion 124 of the donor wafer 120. The results is an SOG structure or substrate 100, e.g. a glass substrate 102 with the relatively thin exfoliation layer or film 122 of semiconductor material bonded to the glass substrate 102.

Figure 8:
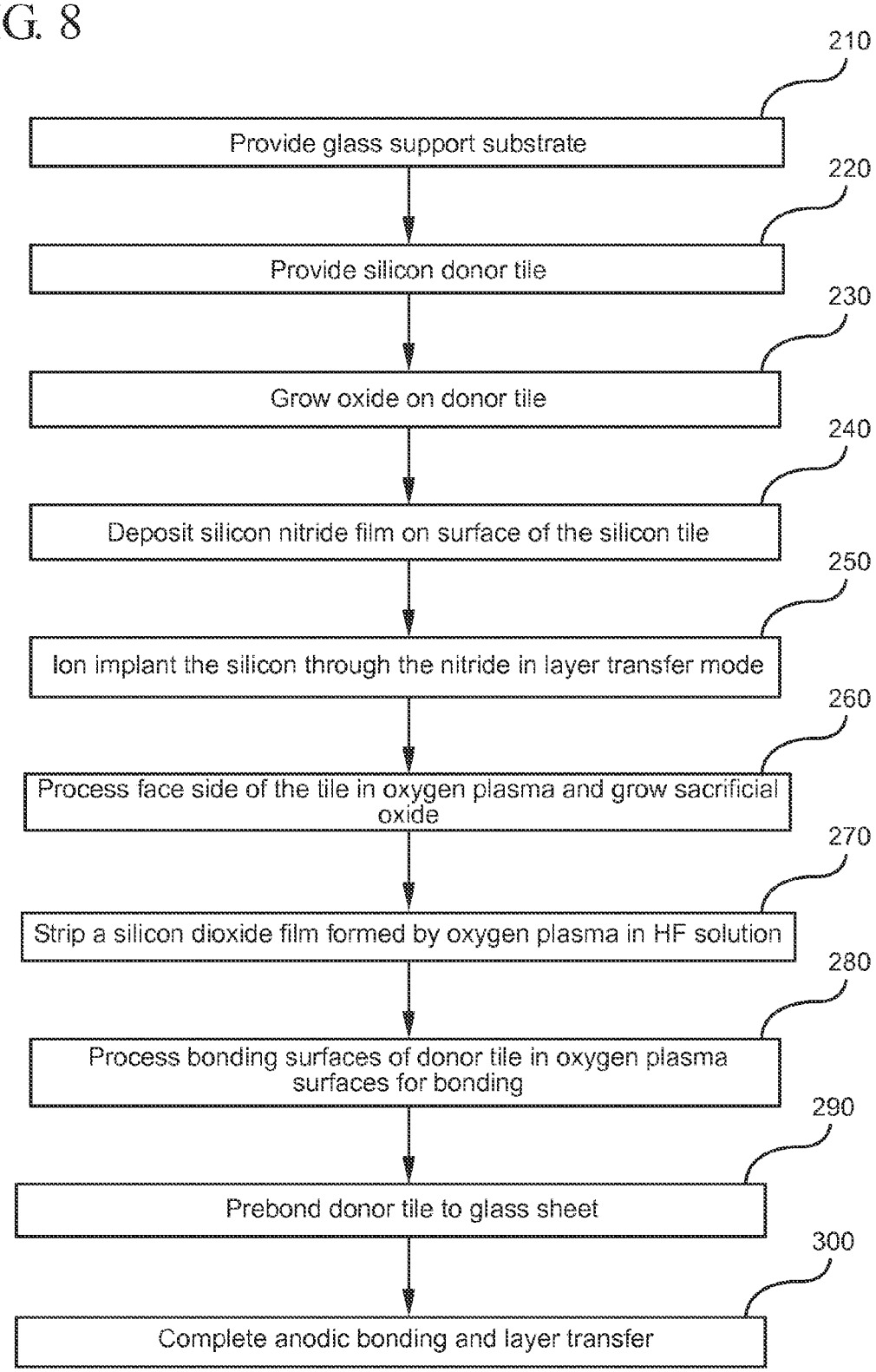
FIG. 8 is a flowchart illustrating an oxygen plasma conversion process for oxidizing the surface of the barrier layer in accordance with an embodiment of the present invention.
Figure 9:
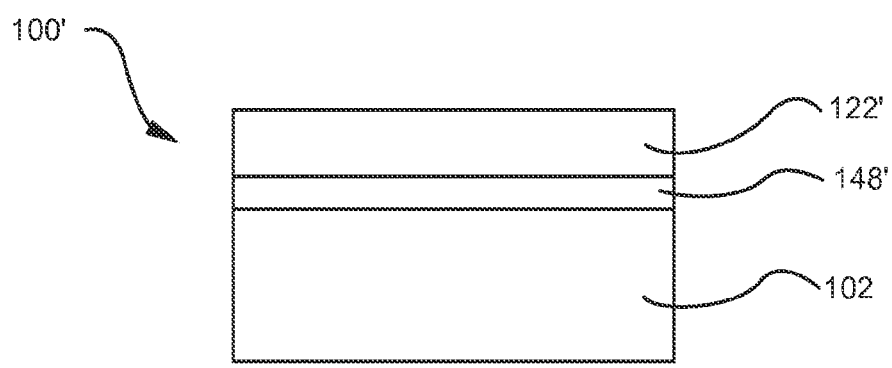
FIG. 9 is a diagrammatic side view of a GeOG structure fabricated using conventional ion implantation film transfer processes.

An exemplary process according to one embodiment for oxygen plasma conversion of the near-surface region of $Si_3N_4$ barrier layer on the donor wafer will now be described in more detail with reference to FIG. 8.

In 210, as previously described herein, Gen 2 size (370×470×0.5 mm) Corning Eagle XG™ glass may be chosen as the insulating support substrate for the fabrication of SiOG.

Gen 2 size glass sheets enable simultaneous fabrication of several 3 inch mobile displays in a cost effective manner on a single glass support substrate.

In Step 220, as previously described herein, according to one embodiment hereof, regular round 300 mm prime grade silicon wafers may be chosen for use as donor wafers 120 or substrates for the fabrication of SiOG structures or substrates. 180×230 mm rectangular donor wafers or donor tiles may be cut from the initially round wafers and the donor tile edges may be processed in order to profile the edges and obtain a round or chamfered profile similar to SEMI standard edge profile. Other required machining steps, such as corner chamfering or rounding and surface polishing, may also be performed.

Figure 2:
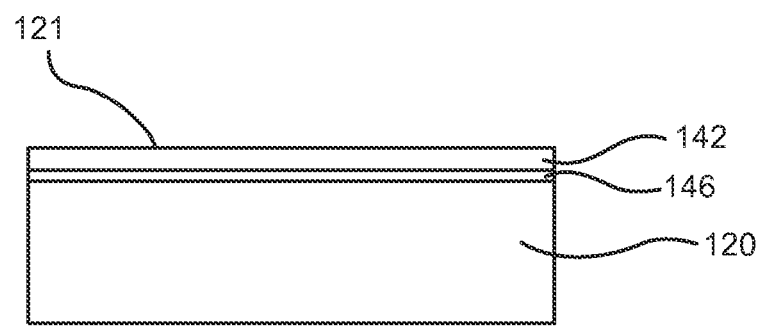
FIG. 2 is a diagrammatic side view of a silicon donor wafer with a barrier layer deposited thereon in accordance with an embodiment of the present invention.

In Step 230, as previously described herein in relation to FIG. 2, an $SiO_2$ (or other oxide) layer 146 (See FIG. 7) is grown or deposited on the bonding surface 121 of the donor tile 120. The surface of the silicon donor tile may be oxidized using thermal, plasma, or chemical oxidation processes before deposition of the $Si_3N_4$ barrier layer. Alternatively, as previously described herein, the native oxide film may be intentionally left on the surface of the donor tile, or steps may be taken to remove the native oxide film or prevent or minimize the formation of a native oxide film on the donor tile.

In Step 240, as previously described herein in relation to FIG. 2, a $Si_3N_4$ barrier layer or film 142 is deposited onto the silicon donor tile 120 over the native or deposited oxide film 146.

In Step 250, as previously described herein in relation to FIG. 3, the donor tiles 120 with the deposited $Si_3N_4$ barrier layer 142 are ion implanted to form the weakened region 123 within the silicon donor tiles and define the silicon exfoliation layer 122. As previously described, a low surface roughness is required for subsequent bonding to the glass. The surface roughness of the bonding surface 121 of the deposited $Si_3N_4$ barrier layer 142 was analyzed by scanning with an atomic force microscopy (AFM) and with an optical technique using Zygo tool. Both methods demonstrated that the surface roughness was in the range from about 0.3 nm to about 1.0 nm RMS for 20×20 $\mu m^2$ AFM. This roughness is known to be good enough for bonding. However, for substrates with such roughness, the bonded assembly typically has defects in the bonding interface (voids). It has been found that a surface roughness under 0.3 nm RMS for 20×20 $\mu m^2$ AFM is required for defect free bonding.

In Step 260, similar to the step as previously described herein, the bonding surface 121 of the $Si_3N_4$ barrier layer 142 is treated with an oxygen plasma conversion process to convert the near surface region of the $Si_3N_4$ barrier layer into a first $SiO_2$ sacrificial layer 148. The resulting layers on the silicon donor tiles now include a first sacrificial $SiO_2$ (oxide) layer 146 on the silicon donor tile, a $Si_3N_4$ barrier layer 142 on the first $SiO_2$ (oxide) layer, and a second $SiO_2$ (oxide) smoothing and bonding layer 148 on the $Si_3N_4$ barrier layer, e.g. an oxide-nitride-oxide or ONO (146-142-148) layered structure on donor tiles.

In order to convert the bonding surface 121 of the $Si_3N_4$ barrier layer 142 (which may have a surface roughness form 0.3 nm to 1.0 nm RMS for 20×20 $\mu m^2$ AFM) into an $SiO_2$ sacrificial layer 148, the donor tiles 120 may be processed in a low frequency, 30 kHz Technics plasma tool. The processing conditions may be: incoming gas of oxygen, oxygen flow of 2 sccm, pressure in the chamber of 30 mTorr, plasma power of 700 W, and process time of 30 minutes. This results in a 15 nm thick $SiO_2$ sacrificial layer 148 in the near surface region of the $Si_3N_4$ barrier layer 142 with a surface roughness slightly below 0.3 nm RMS. A $SiO_2$ sacrificial layer having a thickness in the range of about 2 nm to about 20 nm, or about 7 nm to about 10 nm in thickness may be easily produced on the $Si_3N_4$ barrier layer, such that the barrier effect of the $Si_3N_4$ barrier layer is not compromised.

The $SiO_2$ sacrificial layer 148 produced in Step 260 is near stoichiometric and has a low nitrogen content (under Secondary Ion Mass Spectrometry (SIMS) detection limit) SIMS analysis was performed on donor tiles with $Si_3N_4$ barrier layers with $SiO_2$ films produced according to Steps 210 through 260. No nitrogen was detected near the surface of the $SiO_2$ bonding layer 148. The complete removal of nitrogen in the plasma converted region ensures hydrophilicity and proper bondability of the new bonding surface 121 to the glass support substrate 102.

The smoothing effect of the single and double oxygen plasma conversion treatment was confirmed by the Applicants using SIMS analysis of experimental samples. SIMS analysis showed that the bonding surface 121 of the $SiO_2$ bonding layer 148 is smoother after a relatively long plasma processing time approaching 50 minutes than after a relatively short plasma processing time of just a few minutes. With relatively long plasma processing times greater than 50 minutes, however, the roughening due to sputtering becomes significant. Effective smoothing to a surface roughness of about 0.3 nm RMS or less, or about 0.2 nm RMS or less for 20×20 $\mu m^2$ AFM scan for defect free bonding may be achieved with plasma processing times in a range or from about 2 minutes to about 50 minutes, about 5 minutes to about 20 minutes, or from about 10 minutes to about 25 minutes, or from about 10 minutes to about 20 minutes.

Oxygen plasma conversion of the $Si_3N_4$ surface into $SiO_2$ is not limited to a low frequency plasma tools. RF, microwave, and other types of plasma equipment and processes can be employed as well. Through routine experimentation, one skilled in the art can select proper plasma equipment and conditions, such as plasma power, processing time, oxygen flow, and pressure in the chamber, required to convert the desired thicknesses of the $Si_3N_4$ or other barrier layer into an oxide by oxygen plasma conversion as described herein.

By optionally proceeding now directly to Step 290 described hereinafter, the donor tiles 120 may at this point be used to bond and transfer the exfoliation layers 122 to a glass or silicon support substrate 102 (as previously described herein in relation to FIGS. 5 and 6), with the first $SiO_2$ layers 148 acting as bonding layers, rather than as a sacrificial layers. However, when the silicon donor tiles with the $Si_3N_4$ barrier layer is ion implanted in the previous ion implantation Step 250, the bonding surface 121 of the $Si_3N_4$ barrier layer is contaminated with organics that are adsorbed from the ion implant chamber. This contamination is hard to remove by chemical or mechanical means, but can be easily removed if a sacrificial oxide film is formed underneath the contaminants and the sacrificial oxide film is then removed. The first oxide layer formed by the first oxygen plasma conversion process of Step 260 can be used as such a sacrificial oxide layer. If it is desirable to so remove these contaminants prior to bonding the donor tiles to a support substrate, then the following Steps 270 and 280 may optionally be performed.

In Step 270, the first sacrificial $SiO_2$ layer 148 formed by the first oxygen plasma conversion processing step is stripped by bathing the donor tiles in an HF or other suitable solution. The organics and other contaminants are thus effectively removed from the surface of the $Si_3N_4$ barrier layer 142 with the sacrificial $SiO_2$ layer.

In Step 280, a second oxygen plasma conversion step is performed to 1) smoothen the now organic contaminant free bonding surface 121 of the $Si_3N_4$ barrier layer 142 and 2)

oxidize the bonding surface 121 of the $Si_3N_4$ barrier layer 142 to make it hydrophilic and bondable to the glass or other support substrate 102. The resulting layers on the silicon donor tiles once again now include a first $SiO_2$ (oxide) layer 146 on the silicon donor tile, a $Si_3N_4$ barrier layer 142 on the first $SiO_2$ (oxide) layer, and a second $SiO_2$ (oxide) smoothing and bonding layer 148 on the $Si_3N_4$ barrier layer, e.g. an oxide-nitride-oxide or ONO layered structure (or ONO structure). It was found that the surface roughness of the $SiO_2$ bonding layer 148 after the conversion-strip-conversion cycle with 1 minute plasma process time for the first conversion step and 5 minutes for the second conversion step is about 0.2 nm RMS. This cleaned, highly smooth, hydrophilic surface has excellent bondability and generates high yield at the subsequent bonding step. A very thin $SiO_2$ film having a thickness of 10 nm or less, 7 nm or less, or in the range of 2 to 20 nm, may be easily produced on the $Si_3N_4$ barrier layer, such that the barrier effect of $Si_3N_4$ barrier layer is not compromised while still smoothing the bonding surface. Plasma processing times may be in a range of from about 2 minutes to about 50 minutes, about 5 minutes to about 20 minutes, or from about 10 minutes to about 25 minutes, or from about 10 minutes to about 20 minutes.

Three purposes, namely, efficient cleaning, surface smoothing, and creating a hydrophilic, bondable surface, are simultaneously achieved with the double plasma conversion process, e.g. plasma conversion-strip-plasma conversion ONO generating cycle (or NO generating cycle if no oxide layer is formed on the donor tiles in step 230). The double plasma conversion process is particularly useful for smoothing the bonding surface of the $Si_3N_4$ barrier layer 142, as well as for cleaning the surface of organic contaminants. The plasma-strip-plasma cycle is more efficient in roughness improvement, than, for example, doubling the oxygen plasma processing time performed in a single plasma conversion step. The surface roughness improvement generates increased yields in the bonding step.

In Step 290, as previously described herein in relation to FIG. 5, the glass substrates 102 and donor tiles 120 are pre-bonded. First, the glass substrates and donor tiles area cleaned of contamination and rendered hydrophilic in preparation for bonding. The glass substrates/sheets may be washed in an ammonia bath and dried. The ONO bonding surface 121 on the donor tiles may be cleaned and rendered hydrophilic in an SC1 wash and dried. Prepared donor tiles 120 with the plasma converted $Si_3N_4$ barrier layer 142 are then placed on a glass support substrate 102, with the $Si_3N_4$ barrier layer and $SiO_2$ bonding film located between the glass and the donor tiles, thereby pre-bonding the donor tiles to the glass support substrate. Thus, pre-bonded intermediate donor tile-glass assemblies are formed.

In Step 300, as previously described herein in relation to FIG. 6, the exfoliation layers 122 (with barrier 142 and bonding layers 148 thereon) are bonded to the glass substrate 102 and separated (exfoliated) from the remaining portions 124 of semiconductor donor tiles. First, the donor tile-glass assemblies are placed in a furnace/bonder. Then the furnace is heated, and optional pressure and optional voltage are applied to cause bonding and separation (exfoliation) of the exfoliation layers via an ion implantation thermal or, when voltage is applied, anodic bonding layer transfer process. The exfoliation layers 122 with the ONO structure are thus transferred from the donor tiles and bonded to the glass substrate 102. If necessary, the exfoliated surfaces 125 of the as transferred exfoliation layers 125 may be further processed by annealing, washing or polishing, as previously described herein.

The processes and SOI and SOG structures described herein provide a higher yield at bonding step as compared to processes that use deposited films (deposited either on silicon or on glass). The processes and SOI and SOG structures described herein also ensure high yield of transistors fabrication processes, because of the provision of a superior barrier layer compared the anodically generated in-situ anodic $SiO_2$ barrier layer and ion depleted glass layer.

According to a further embodiments disclosed herein, the disclosed oxygen plasma conversion process may be performed directly to the surface of a donor wafer, e.g. without the prior fabrication of a barrier layer on the boding surface of the donor wafer. For the following discussion, it will be assumed that the semiconductor-on-substrate structure is an SOI structure, such as a semiconductor-on-glass structure (SOG), or more particularly, a germanium-on-glass structure or substrate (GeOG).

Referring now to FIG. 9 through 13 a GeOG structure 100' according to certain embodiments hereof may include a glass handle substrate 102, a thin germanium device layer 122' bonded to the glass handle substrate. A barrier layer 148' may be located between the glass handle substrate and the germanium device layer. Such a GeOG structure 100' may have suitable uses in connection with fabricating thin film transistors (TFTs), e.g., for display applications, including organic light-emitting diode (OLED) displays and liquid crystal displays (LCDs), image sensors, integrated circuits, photovoltaic devices, thermoelectrics, etc. Although not required, the semiconductor material of the layer 122' may be in the form of a substantially single-crystal Ge material.

As previously described, the semiconductor material may be a silicon-based (Si) semiconductor or any other type of semiconductor, such as, the III-V, II-IV, II-IV-V, etc. classes of semiconductors. Examples of potential semiconductor materials include: silicon (Si), germanium-doped silicon (SiGe), silicon carbide (SiC), gallium arsenide (GaAs), GaP, and InP.

As previously described, support substrate 102, may be any desirable material exhibiting any desirable characteristics. For example, in some embodiments, the substrate 102 may be formed from an insulator such as glass, glass-ceramic, an oxide glass, or an oxide glass-ceramic. As between oxide glasses and oxide glass-ceramics, the glass may have the advantage of being simpler to manufacture, thus making them more widely available and less expensive. By way of example, a glass substrate 102 may be formed from glass containing alkaline-earth ions, such as, substrates made of Corning Incorporated glass composition nos. 1737, 7059, or Corning Incorporated EAGLE™ glass. These glass materials have particular use in, for example, the production of liquid crystal displays. The coefficient of thermal expansion (CTE) of the glass in comparison to the donor wafer material needs to be taken into account for effective layer transfer to the glass. In the case of SiOG, silicon has good CTE match with Eagle XG™ (See Table 1 below). In contrast, there exists a larger CTE mismatch between the Ge and Eagle XG™, Corning 1737 glass, or Corning 7059 glass. Of all of the glasses listed in Table 1 are fusion drawn, so the surface roughness and surface flatness are of superior quality. Of the glasses in Table 1, Corning 7059 glass has the best CTE match with Ge, although there still exists 1.2 ppm/° C. of CTE difference.

TABLE 1

| | Si | Ge | EagleXG | Corning 1737 | Corning 7059 |
|---|---|---|---|---|---|
| CTE (ppm/° C.) | 3.4 | 5.8 | 3.2 | 3.7 | 4.6 |

The Ge donor wafer 120' was prepared, such as by polishing, cleaning, etc. to produce a relatively flat and uniform implantation surface 121' suitable for bonding to the support or handle substrate 102, e.g., a glass or glass-ceramic substrate. Such cleaning processes are well understood in the art. One of skill in the art will be able to arrive at a suitable substrate cleaning process.

Figure 10:
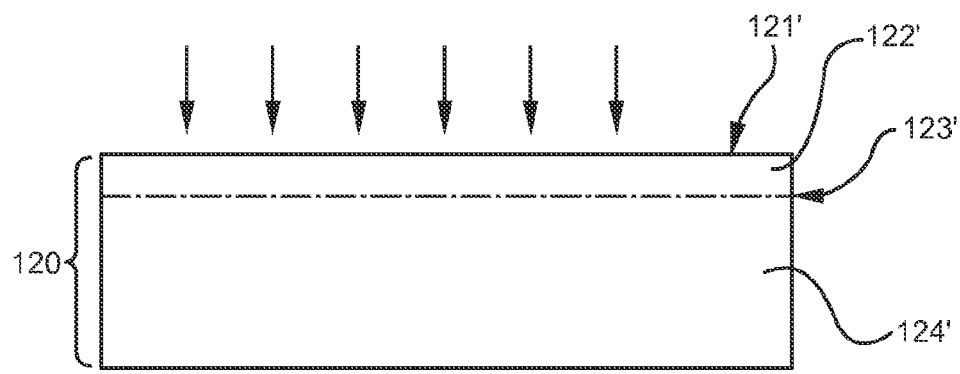
FIG. 10 is a diagrammatic side view of the GeOG structure of FIG. 9 being implanted with ions in accordance with an embodiment of the present invention

Turning now to FIG. 10, as previously described herein in relation to FIG. 3, an exfoliation layer 122' is created in the Ge donor wafer 120' by subjecting the bonding surface 121' of the donor wafer to an ion implantation process to create a weakened region 123' below the bonding surface 121'. As previously described, the ion implantation energy may be adjusted to achieve a general ion implantation depth below the surface of the donor wafer and define a thickness of the exfoliation layer 122', such as between about 300-800 nm, although any reasonable thickness may be achieved from 50 nm to 2 microns.

Figure 11:
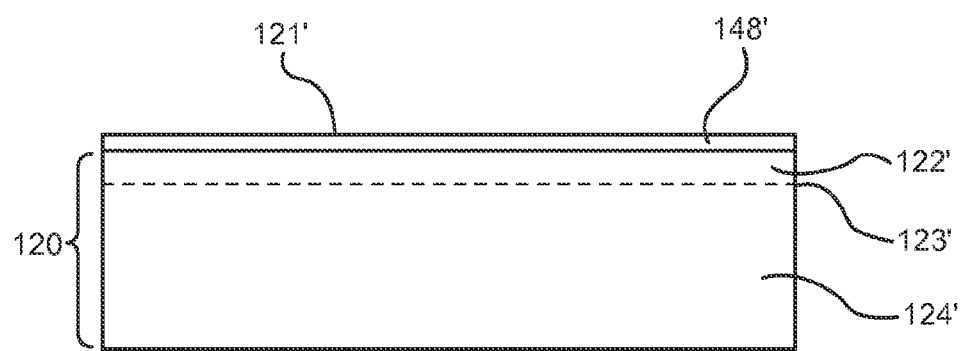
FIG. 11 is a diagrammatic side view of the GeOG structure of FIG. 10 with an oxide layer formed thereon in accordance with an embodiment of the present invention.

With reference now to FIG. 11, following the ion implantation step the bonding surface 121' of the Ge donor wafer 120' is rinsed to remove organics and oxides. As previously described herein a glass support substrate 102 is also washed and prepared for bonding. The cleaned bonding surface 121' of the Ge donor wafer 120' is then subjected to an oxygen plasma conversion process, as previously described herein in relation to FIG. 4, in order to convert a near surface region of the bonding surface 121' the exfoliation layer 122' into a germanium oxide bonding layer 148.' The Ge bonding layer 148' makes the bonding surface 121' of the donor wafer hydrophilic and prepares it for bonding. The bonding layer 148 may be of any suitable thickness, such as, by way of example only, a thickness in the range of from about 50 nm to about 150 nm. As previously described, the oxygen plasma conversion step also smoothens the bonding surface 121', making it more suitable for bonding. If desired, a double plasma oxygen conversion step may be carried out to further smoothen the surface of the donor wafer 120'. As previously described, in order to perform a double plasma conversion process, the first germanium oxide bonding layer 148' may be stripped with HCl, and a second plasma conversion step may be carried out on the Ge donor wafer to form a second, smoother germanium oxide bonding layer 148'.

Figure 12:
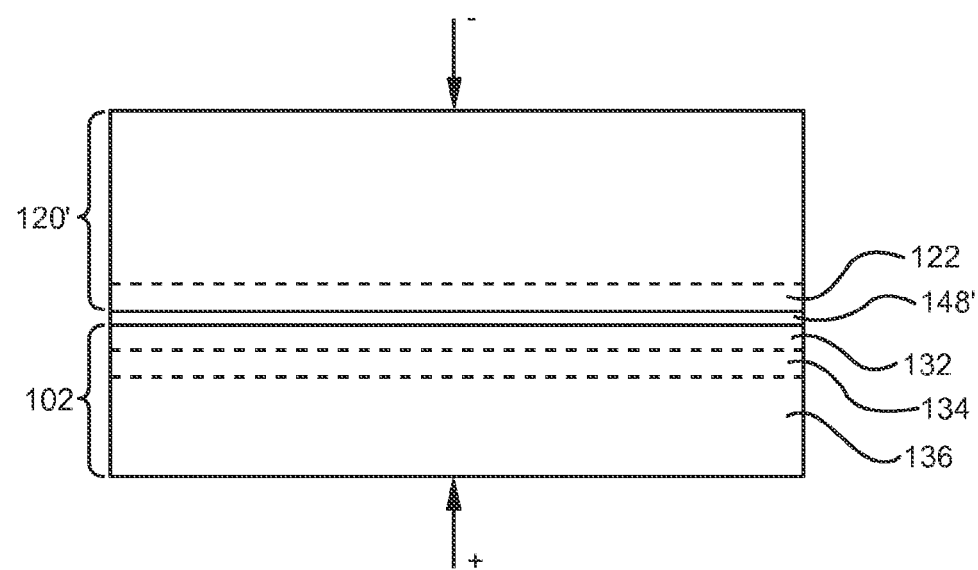
FIG. 12 is a diagrammatic side view of the GeOG structure of FIG. 11 in the process of being bonded to a glass support or handle substrate layer in accordance with an embodiment of the present invention.

As diagrammatically illustrated in FIG. 12, and as previously described in relation to FIG. 5, the germanium donor wafer 120' is then pre-bonded to the glass support substrate. Next, the exfoliation layer 122' is bonded to the glass support substrate 102 using either a thermal or anodic bonding exfoliation process as previously described herein in relation to FIG. 6. The germanium oxide layer 148' on donor wafer 120' forms a buried germanium oxide barrier layer barrier layer between the glass support substrate 102 and the Ge exfoliation layer 122'. As previously described herein in relation to FIG. 6, in the case of anodic bonding, a voltage potential (indicated by the arrows in FIG. 3) is also applied to the pre-bonded structure. For example, a positive electrode may be applied to Ge donor wafer 120' and a negative electrode may be applied to the glass handle substrate 102e. The application of the voltage potential causes alkali or alkaline earth ions in the glass substrate 102 to move away from the semiconductor/glass interface further into the glass substrate 102, forming. (1) a reduced (as compared to the original bulk glass composition) positive ion concentration layer 132 in the top of the glass handle substrate 102 adjacent the exfoliation layer 122; and (2) an enhanced or increased (as compared to the original bulk glass composition) positive ion concentration layer 134 of the glass substrate 102 adjacent the reduced positive ion concentration layer 132, with remaining portion 136 of the glass substrate remaining as unchanged original bulk glass material. This formation of a reduced ion concentration layer in the top layer glass handle substrate 102 adjacent the exfoliation layer 122 results in barrier functionality.

Figure 13:
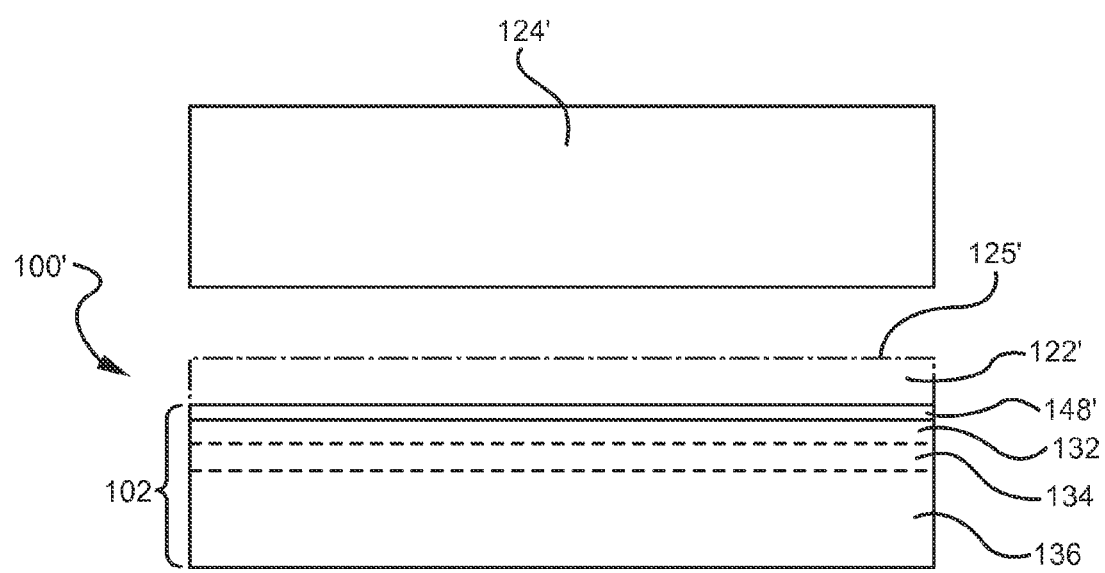
FIG. 13 is a diagrammatic side view of the Ge exfoliation layer separated from a remaining portion of the donor Ge wafer and bonded to a glass support substrate in accordance with an embodiment of the present invention.

As illustrated in FIG. 13, and as previously described in relation to FIGS. 6 and 7. The Ge donor wafer 120' is cleaved or separated along the implanted weakened region 123' during or following the bonding process, thereby leaving a thin germanium exfoliation layer 122' attached to glass handle substrate 102, resulting in a GeOG structure 100' with a deposited/buried oxide barrier layer 148'. As previously described herein, optional post cleave processing of the thin germanium exfoliation layer may be performed. Moreover, the remaining portion 124' of the donor wafer may be refinished and reused as a door wafer 120' numerous times for the creation of numerous additional GeOG structures 100'.

According to further embodiments hereof, and as previously described herein in relation to the barrier layer 142 in FIG. 2 through 4, a barrier layer (not shown) may be deposited on the Ge donor wafer 120' prior to oxygen plasma conversion of the bonding surface 121'. In which, the surface of the barrier layer may be subject to the oxygen plasma conversion step(s) to render it hydrophilic smoothen it in preparation for bonding. Suitable barrier layer or layers for a Ge donor wafer include: silicon nitrides ($Si_xN_y$), and silicon oxy-nitrides (SiOxNy). The resulting GeOG structure 100' essentially would be the same as SiOG structure 11 illustrated in FIG. 7, with the Ge exfoliation layer in place of the Si exfoliation layer an the deposited barrier layer in place of the $Si_3N_4$ barrier layer. The resulting structure may be fabricated with or without an oxide layer (similar to layer 146 described above) between the Ge exfoliation layer and the deposited barrier layer.

With reference to FIG. 4, after the intermediate assembly is held under the conditions of temperature, pressure and voltage for a sufficient time, the voltage is removed and the intermediate assembly is allowed to cool to room temperature. At some point during heating, during a dwell, during cooling, and/or after cooling, the exfoliation layer 122 exfoliates (e.g. separates or cleaves) from the remaining portion 130 of the donor wafer 120 and the remaining portion 130 of the donor wafer 120 and the glass handle substrate 102 may separated. This may include some mechanical peeling or cleaving if the exfoliation layer 122 has not already become completely free from the remaining portion 130 of the donor wafer 120. The result is a glass substrate 102 with the relatively thin semiconductor exfoliation layer 122 bonded thereto. The separation may be accomplished via fracture of the exfoliation layer 122 due to thermal stresses during heating or cooling. Alternatively, or in addition, mechanical stresses such as a water jet or chemical etching may be used to facilitate the separation of the exfoliation layer from the remaining portion of the donor wafer.

Following just after exfoliation, the cleaved surface 125 of the SOI structure or substrate 100 may exhibit excessive surface roughness, excessive silicon layer thickness, and/or implantation damage of the silicon layer (e.g., due to the formation of an amorphized silicon layer). Depending on the implantation energy and implantation time, the thickness of the exfoliation layer 122 may be on the order of about 300-500 nm, although other thicknesses may also be suitable.

These characteristics may be altered using post bonding processes in order to advance from the exfoliation layer 122 and produce the desirable characteristics of the semiconductor layer 1104, 122 (FIG. 1). It is noted that the remaining portion 130 of the donor semiconductor wafer 120 may be refinished and reused to continue producing further SOI structures 100.

If anodic bonding is not required in any of the previously described embodiments, then the application of a voltage potential may be dispensed with and a thermal bonding process may be employed to bond the exfoliation layer to 122, 122' to the handle substrate 102. In which case, the SOG structure may be produced using a "Smart-Cut" thermal bonding process as described in U.S. Pat. No. 5,374,564, the entire disclosure of which is hereby incorporated by reference. When anodic bonding is not employed, then the previously described ion depleted and in situ $SiO_2$ barrier layers are not formed in the SOG substrate. Thus, there may be an enhanced need for the addition of an effective barrier layer, such as a silicon nitride or other barrier layer, between the glass handle substrate and the semiconductor exfoliation layer when anodic bonding is not employed to bond a semiconductor film to a glass support substrate.

Various embodiments will be further clarified by the following examples.

Experiment 1

Efficacy of the $Si_3N_4$ barrier layer as a barrier layer in SiOG was tested. In a first test the SiOG structure was annealed at 600° C. for 24 hour and contamination in the silicon exfoliation layer was measured with Secondary Ion Mass Spectrometry (SIMS) analysis. SIMS analysis found no contamination. In the second test, an electric voltage 100 V was applied between top and bottom surfaces of the SiOG, and the sample was also heated to 600° C. Again, SIMS was used to detect contamination in the silicon film. Contamination of the Si exfoliation layer was found to be below the SIMS detection limit. A 5-layer SiOG structure made per '528 patent previously referred to herein might pass the first test, but would not pass the second test.

This experiment confirms that $Si_3N_4$ is a more effective barrier layer than is otherwise provided by the anodic bonding process.

Experiment 2

A $Si_3N_4$ film was deposited on silicon donor tiles with a standard LPCVD tool using argon-diluted silane and ammonia mixture, 40 sccm total gas flow rate, 3:1 ratio of silane and ammonia, at 800° C. and 1 mTorr pressure in the chamber. This resulted in a deposition rate of about 2 nm/minute and deposition of a 100 nm thick $Si_3N_4$ barrier layer on the donor tiles.

An attempt to bond the $Si_3N_4$ coated silicon donor tile directly to an Eagle glass support substrate or sheets was made. The door tiles were prepared for the bonding by processing the donor tiles in RCA solution and drying. The glass sheets were prepared by processing the glass sheets in an ammonia bath and drying. The hydrophilicity of the nitride and glass surfaces was measured using a Kruss DSA20 instrument to measure the wetting angle of the surfaces. The glass surface was found to be highly hydrophilic with a wetting angle below 2°. The surface of the $Si_3N_4$ barrier layer was found to have a mild hydrophilicity with a wetting angle of 35°. The glass and the tile were pre-bonded by initially contacting them at one edge to initiate a bonding wave at one edge and propagating the bonding wave across the glass and tile substrates. The pre-bonded intermediate assembly was heated to 600° C. This attempt at directly bonding the $Si_3N_4$ coated silicon donor tile directly to an Eagle glass support substrate failed. There were many voids on the bonding interface.

This experiment confirms that $Si_3N_4$ is not directly bondable to glass.

Experiment 3

Standard prime grade silicon wafers that were 300 mm size, <100> orientation, p-type, boron doped, 8 to 13 Ohm-cm resistivity, and 775 micron thick were selected as donor wafers. A $Si_3N_4$ layer was deposited on the donor wafers using the following LPCVD technique. The wafers were loaded into LPCVD reactor without stripping of a native oxide film from the wafers. The LPCVD process was performed at 800° C. The process temperature, time, and pressure in the chamber and reactive gases were chosen to obtain 100 nm thick stoichiometric $Si_3N_4$ layer on the bonding surface of the donor wafer. The thickness uniformity of the deposited $Si_3N_4$ layer was measured with ellipsometry technique and it was found to be 100 nm+/−1% of thickness. Roughness of the surface of the deposited $Si_3N_4$ layer was measured using AFM and it was found to be 0.2 nm RMS in roughness, which is sufficient for further wafer bonding processing. Stresses in the deposited $Si_3N_4$ layer were measured using Tencor FLX tool and were found to be 700 MPa tensile stress. The $Si_3N_4$ layer was observed to be continuous without flakes. Trial depositions of thicker $Si_3N_4$ layer were performed to estimate the stability of the $Si_3N_4$ layer at various thicknesses. It was found that the $Si_3N_4$ layer started flaking when the layer thickness exceeded 350 nm.

This experiment demonstrates that Si3N4 barrier layers up to 350 nm thick can be use in the previously described SiOG fabrication process of without risk of lowering the process yield.

The silicon donor wafers with $Si_3N_4$ barrier layers deposited thereon were then implanted with hydrogen. The hydrogen implantation dose and energy was 5.5 E16 cm-2 and 30 keV respectively. This implantation condition causes exfoliation at a depth of about 300 nm under the surface of the donor wafer with the $Si_3N_4$ barrier layer deposited thereon, such that a stack consisting of 100 nm of $Si_3N_4$ and 200 nm of silicon exfoliation layer of crystalline silicon is transferred to the glass substrate.

Gen2 size sheets of standard display glass, e.g. Corning Eagle XG glass that has a low roughness suitable for bonding, having a thickness of 0.5 mm were selected as the glass support substrate. The glass was cleaned with a wet ammonia process. The glass sheets were then rinsed in deionized water and dried. Hydrophilicity of the prepared glass surface was tested with contact wetting angle measurements. The wetting angle was found to be below the lowest angle that is possible to measure with the setup −2°. It indicates good bondability of the glass surface.

The silicon wafer and glass were then pre-bonded. The pre-bonded glass-silicon assembly was loaded into a furnace for bonding and exfoliation. The glass-donor wafer assemblies were placed horizontally in the furnace with the donor wafer on the bottom side facing down. The assembly was first heated to 100-200° C. for 1 hour. This step increases the bonding strength between silicon and glass thus eventually improving layer transfer yield. The temperature was then ramped up to 600° C. to cause the exfoliation.

The fabricated SiOG substrates were analyzed using atomic force microscopy, scanning electron microscopy, optical microscopy in transmission Nomarski mode, and with confocal optical microscopy. The resulting as transferred exfoliation layer produced using a $Si_3N_4$ barrier demonstrated significantly improved as transferred exfoliation layer/film surface morphology and crystalline quality compared to when using just a $SiO_2$ barrier layer. Also, a transmission electron microscope (TEM) cross section analysis of SiOG film with $Si_3N_4$ barrier layer showed no visible crystal defects in the film. Scanning electron microscope (SEM) surface analysis of SiOG as transferred films also revealed superior surface morphology for SiOG/$Si_3N_4$ SiOG substrates (see FIG. 13) and relatively poor surface quality with visible canyon type damages surface damages which penetrates Si exfoliation layer/film depth (see FIG. 14). Secondary ion mass spectroscopy (SIMS) on the SiOG so produced using a $Si_3N_4$ barrier layer revealed a high purity Si thin film.

This experiment demonstrates that $Si_3N_4$ forms an effective barrier layer for the prevention ionic element migrations such as sodium and alkalis from glass into the Si thin film.

Experiment 4

100-mm-diameter, N-type <100> prime germanium wafers with a resistivity greater than 40 ohm-cm purchased from Silicon Valley Microelectronics (SVM) were ion implanted with $H_2$ ions at an implant energy of 100 KeV. The wafers were implanted four times at a tilted incident angle of 7° to create a cleave plane/weakened region in the wafers. The wafers were rotated by 90° between each implantation to receive a total dosage of 4.2 E16 $cm^{-3}$. The implanted Ge donor wafers were cleaned using a standard SiOG clean recipe for the Si wafers. The recipe included de-ionized water with ozone, $NH_4OH/H_2O_2$ mixture (SC1), and HCl/diluted HF mixture. The exfoliation layers were then bonded and transferred to glass support substrates to form GeOG structures. In addition, n-type <100> Ge wafers with lower surface roughness were purchased from AXT Inc. for material and surface characterizations.

Analysis of the resulting GeOG structures revealed Newton rings through the glass which indicates that the Ge wafer and the EagleXG™ glass are not bonded. This experiment demonstrates that prior art SiOG cleaning processes are not sufficient to render the surface of a GE donor wafer adequately bondable to glass.

RIE oxygen plasma conversion (a dry process) was then utilized to convert the bonding surface of the Ge donor wafer to germanium oxide prior to bonding. The oxygen plasma was generated in a reactive-ion-etch system with a power density of 0.35 $W/cm^2$ and a RF frequency of 13.56 MHz. The oxygen flow was 75 sccm, and the partial pressure was 20 mTorr. Typically 180 seconds of process time was sufficient to render the Ge surface bondable.

The oxygen plasma treated/converted Ge donor wafers are then placed on the glass support substrates. The oxygen plasma converted bonding surfaces of the Ge donor wafers spontaneously pre-bonds to the EagleXG™ glass support substrates. Because there was no wet cleaning process before pre-bonding, the pre-bonded intermediate donor wafer-glass substrate assemblies exhibited a few voids as result of particles remaining on the pre-bonded surfaces. These particle-induced voids can be eliminated with proper cleaning processes prior to pre-bonding.

Analysis of experimental samples manufactured using ion thin film transfer processes with oxygen plasma conversion of a Ge donor wager revealed fully-transferred Ge thin films on EagleXG™ and on Glass 7059 respectively. The thickness of the transferred films was around 0.5 um. In both cases, the Ge wafers were subjected to an oxygen plasma conversion step and then bonded with the glass support substrates and split in the oven at a maximum temperature of 350° C. All the surface-roughness values (peak-to-valley, RMS, and Ra) of the as-transferred film increased consistently by two times compared to the as-implanted surface, e.g. Nevertheless, the as-transferred Ge film on EagleXG™ fabricated with an with an ion implantation thin film transfer process with oxygen plasma conversion exhibited a supreme surface roughness of 3.7 nm RMS when compared to a Ge film formed on EagleXG with an with an ion implantation thin film transfer process without an oxygen plasma conversion step, which had a surface roughness of 20 nm RMS.

Advantages of using semiconductor donor wafer having a barrier layer with an oxygen plasma converted oxide layer as disclosed herein in an SOG structure and processes for manufacturing the same include:

Improved as transferred semiconductor exfoliation layer surface morphology,
Improved as transferred semiconductor exfoliation layer surface smoothness,
Reduced mechanical polishing costs,
Superior barrier layer that enables production of a semiconductor exfoliation layer on glass that retains a high level of purity for fabrication of SOG based electronic devices with superior electrical performance and lifetime,
Smoother bonding surface on the donor wafer, leading to improved bonding yields,
The bonding surface of the barrier layer is rendered hydrophilic for bonding to glass, leading to improved bonding yields,
In the case of double plasma conversion, removal of contamination from the surface of the donor wafer, leading to improved bonding yields and improved electronic device yields and performance,
Simultaneous satisfaction of hydrophilicity, smoothness and thinness requirements for effective high yield bonding is achieved, while maintaining the barrier effect of the barrier layer,
Facilitates the bonding GE layers/films with the glass and enables the full-area Ge layer transfer,
Improved overall layer transfer quality,
Elimination of the external force previously required to force Ge to bond to the glass substrate,
Enables high-throughput and low-cost thermal bonding and layer transfer of GE layers to glass,
Both, plasma processing, and HF strip are routine manufacturing processes that can be easily scaled up for volume manufacturing and lager size donor and handle substrates.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It will be apparent to those skilled in the art that various modifications and variations can be made without departing from the spirit or scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of preparing a bonding surface of a semiconductor wafer for bonding to a substrate, comprising:
   obtaining a semiconductor wafer having a bonding surface;
   implanting ions through the bonding surface into the semiconductor wafer to form a weakened region in the semiconductor wafer and defining a semiconductor exfoliation layer in the semiconductor wafer between the weakened region and the bonding surface, the implanting step contaminates a surface region of the bonding surface of the semiconductor wafer to form a contaminated surface region;
   treating the bonding surface of the implanted semiconductor wafer with oxygen plasma to oxidize the bonding surface of the semiconductor wafer, thereby converting the contaminated surface region of the bonding surface of the semiconductor wafer into a sacrificial oxide layer, while a remaining portion of a barrier layer remains un-oxidized;
   stripping the sacrificial oxide layer from the bonding surface of the semiconductor wafer, thereby removing the contaminated surface region of the bonding surface of the semiconductor wafer and revealing a clean bonding surface of the semiconductor wafer;
   treating the clean bonding surface of the semiconductor wafer with oxygen plasma to oxidize the bonding surface of the semiconductor wafer and convert a surface region of the semiconductor wafer into an oxide bonding layer that is hydrophilic and bondable to the substrate;
   obtaining an insulating support substrate having a bonding surface;
   contacting the bonding surface of the semiconductor wafer with the bonding surface of the insulating support substrate;
   bonding the bonding surface of the semiconductor wafer to the support substrate; and
   separating the semiconductor exfoliation layer from a remaining portion of the semiconductor wafer along the weakened region, leaving the semiconductor exfoliation layer bonded to the support substrate.

2. The method of claim 1, wherein the support substrate is a glass insulating substrate.

3. The method of claim 1, wherein the semiconductor wafer is a Ge wafer.

4. A method of preparing a semiconductor wafer for bonding to a substrate, comprising:
   obtaining a semiconductor wafer having a barrier layer formed of barrier material on one surface thereof that forms a bonding surface on the semiconductor wafer;
   implanting ions through the bonding surface into the semiconductor wafer to form a weakened region in the semiconductor wafer and defining a semiconductor exfoliation layer in the semiconductor wafer between the weakened region and the bonding surface, the implanting step contaminates a surface region of the bonding surface of the semiconductor wafer;
   treating the bonding surface of the semiconductor wafer with oxygen plasma to oxidize the bonding surface of the semiconductor wafer, thereby converting a near surface region of the barrier layer into an oxide layer and smoothening a surface of the barrier layer to a surface roughness of 0.3 nm RMS or less, thereby creating a barrier bonding surface that is smooth, hydrophilic and bondable to the substrate;
   obtaining an insulating substrate having a bonding surface;
   contacting the bonding surface of the semiconductor wafer with the bonding surface of the insulating substrate;
   bonding the oxide layer to the insulating substrate, thereby bonding the semiconductor wafer to the insulating substrate; and
   separating the semiconductor exfoliation layer from a remaining portion of the semiconductor wafer along the weakened region, leaving the exfoliation layer bonded to the insulating substrate via the oxide layer with remaining portion of the barrier layer located between the semiconductor exfoliation layer and the oxide layer.

5. The method of claim 4, wherein the barrier layer is formed of one of $Si_xN_y$ and $SiN_xO_y$.

6. The method of claim 5, wherein the step of treating the bonding surface of the semiconductor wafer converts the surface region of the barrier layer into an oxide layer having a surface roughness of less than 0.3 nm RMS.

7. The method of claim 5, wherein the substrate is a glass substrate having a bonding surface.

8. The method of claim 7, wherein the barrier layer is formed of $Si_3N_4$.

9. The method of claim 7, wherein the glass substrate is an the oxide glass or oxide glass-ceramic substrate; and
   the step of bonding the oxide layer to the glass substrate further includes applying a voltage potential across the glass substrate and the semiconductor wafer, and the elevated temperature and the voltage are maintained for a period of time sufficient for positive ions within the oxide glass or oxide glass-ceramic to move within the glass substrate in a direction away from the semiconductor wafer, such that the glass substrate includes (i) a first glass layer adjacent to the semiconductor exfoliation layer in which substantially no modifier positive ions are present, and (ii) a second glass layer adjacent the first glass layer having an enhanced concentration of modifier positive ions.

10. The method of claim 5,
    wherein the step of treating the bonding surface of the semiconductor wafer converts a contaminated surface region of the barrier layer into a sacrificial oxide layer, while a remaining portion of the barrier layer remains un-oxidized barrier material; and
    further comprising:
    stripping the sacrificial oxide layer from the barrier layer, thereby removing the contaminated surface region of the barrier layer and revealing a cleaned bonding surface on the barrier layer; and
    treating the cleaned bonding surface with oxygen plasma to oxidize the bonding surface of the barrier layer and convert a surface region of the barrier layer into an oxide bonding layer is hydrophilic and bondable to the glass substrate.

11. The method of claim 10, wherein the step of treating the cleaned bonding surface with oxygen plasma is conducted for a processing time of from about 2 minutes to about 50 minutes and produces the oxide bonding layer with a thickness of about 10 nm or less, and a surface roughness of about 0.3 nm RMS or less.

12. The method of claim 11, wherein the step of treating the cleaned bonding surface with oxygen plasma is conducted for a processing time of from about 5 minutes to about 20 minutes, or from about 10 minutes to about 25 minutes, or from about 10 minutes to about 20 minutes, and produces the oxide bonding layer with a thickness of about 7 nm or less, or from about 2 nm to about 20 nm.

13. The process of claim 10, wherein the step of treating the cleaned bonding surface with oxygen plasma converts a surface region of the barrier layer into an oxide bonding layer having a surface roughness of 0.3 nm RMS or less thereby smoothing the surface of the barrier layer.

14. The method of claim 5, wherein the step of treating the bonding surface of the semiconductor wafer converts the surface region of the barrier layer into an oxide layer having a thickness of about 5 nm to about 50 nm, about 2 nm to about 20 nm, about 5 nm to about 10 nm, or about 5 nm.

15. The method of claim 4, wherein the barrier layer is deposited on the semiconductor wafer with a thickness of about 100 nm or greater, about 250 nm or greater, or about 350 nm or greater.

16. The method of claim 4, wherein the semiconductor wafer is formed of substantially single crystal silicon.

* * * * *